US012145161B2

(12) United States Patent
Felber et al.

(10) Patent No.: US 12,145,161 B2
(45) Date of Patent: Nov. 19, 2024

(54) SYSTEM AND METHOD FOR JETTING DISPENSER POSITIONAL CONTROL

(71) Applicant: NORDSON CORPORATION, Westlake, OH (US)

(72) Inventors: Andrew Felber, Cumberland, RI (US); Richard Murphy, Norton, MA (US); Frederick Doering, Providence, RI (US)

(73) Assignee: Nordson Corporation, Westlake, OH (US)

( * ) Notice: Subject to any disclaimer, the term of this patent is extended or adjusted under 35 U.S.C. 154(b) by 906 days.

(21) Appl. No.: 17/251,509

(22) PCT Filed: Jun. 25, 2019

(86) PCT No.: PCT/US2019/038968
§ 371 (c)(1),
(2) Date: Dec. 11, 2020

(87) PCT Pub. No.: WO2020/005929
PCT Pub. Date: Jan. 2, 2020

(65) Prior Publication Data
US 2021/0245188 A1 Aug. 12, 2021

Related U.S. Application Data

(60) Provisional application No. 62/689,694, filed on Jun. 25, 2018.

(51) Int. Cl.
*B05B 12/00* (2018.01)
*B05B 1/30* (2006.01)
(Continued)

(52) U.S. Cl.
CPC .......... *B05B 12/004* (2013.01); *B05B 1/3046* (2013.01); *B05B 12/08* (2013.01); *B05C 5/0225* (2013.01); *G05D 3/12* (2013.01)

(58) Field of Classification Search
CPC ....... B05C 5/0225; B05C 5/02; B05B 1/3046; B05B 12/004; B05B 12/08; B05B 12/082;
(Continued)

(56) References Cited

U.S. PATENT DOCUMENTS 5,490,015 A 2/1996 Umeyama et al.
2005/0235966 A1 10/2005 Lixl et al.
(Continued)

FOREIGN PATENT DOCUMENTS

CN 102099608 A 6/2011
CN 103502614 A 1/2014
(Continued)

*Primary Examiner* — Christopher R Dandridge
(74) *Attorney, Agent, or Firm* — Baker Hostetler

(57) ABSTRACT

Systems and methods of controlling movement of a moving part of an applicator for jetting material from the applicator are disclosed. The method includes actuating a piezoelectric device operatively connected to a needle by providing a voltage waveform to the piezoelectric device, such that the needle translates along a positional path in a first dispensing operation. The method also includes sensing positions of the moving part over a period of time, where the positions define a time-dependent positional profile of the moving part, and receiving parameters for a second dispensing operation. The method also includes determining a required voltage waveform to be applied to the piezoelectric device to perform the second dispensing operation, and adjusting the voltage waveform provided to the piezoelectric device to match the required positional profile.

24 Claims, 15 Drawing Sheets

(51) Int. Cl.
*B05B 12/08* (2006.01)
*B05C 5/02* (2006.01)
*G05D 3/12* (2006.01)

(58) Field of Classification Search
CPC . B05B 17/0607; B05B 1/083; B95C 11/1034; B95C 11/007; B95C 11/1013
See application file for complete search history.

(56) References Cited

U.S. PATENT DOCUMENTS

| | | |
|---|---|---|
| 2009/0306830 A1 | 12/2009 | Cummings et al. |
| 2016/0136661 A1 | 5/2016 | Hong et al. |
| 2018/0221910 A1 | 8/2018 | Burzo et al. |
| 2019/0168251 A1 | 6/2019 | Brevemark |

FOREIGN PATENT DOCUMENTS

| | | | |
|---|---|---|---|
| CN | 103835931 A | 6/2014 | |
| CN | 105604927 A | 5/2016 | |
| CN | 105934577 A | 9/2016 | |
| CN | 105983506 A | 10/2016 | |
| CN | 106166530 A | 11/2016 | |
| CN | 106583166 A | 4/2017 | |
| CN | 107149996 A | 9/2017 | |
| CN | 107921460 A | 4/2018 | |
| EP | 2732884 A2 | 5/2014 | |
| JP | 2016-098828 A | 5/2016 | |
| JP | 2018-526210 A | 9/2018 | |
| JP | 2019-523698 A | 8/2019 | |
| WO | WO-2014139568 A1 * | 9/2014 | ........... B05B 12/082 |
| WO | WO-2017040648 A1 * | 3/2017 | ......... B05C 11/1034 |
| WO | WO-2017202985 A1 * | 11/2017 | ............. B05B 1/083 |

* cited by examiner

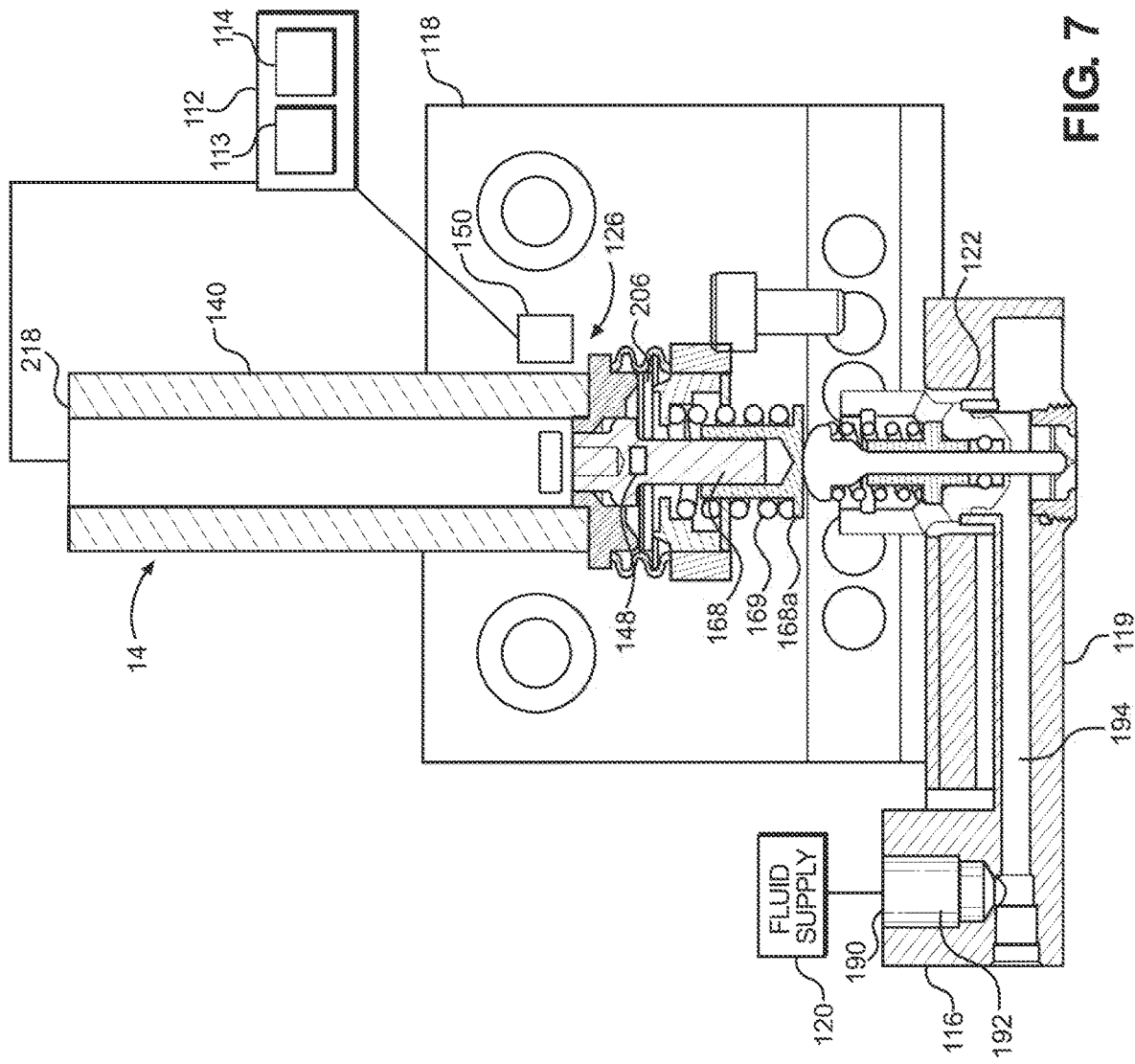

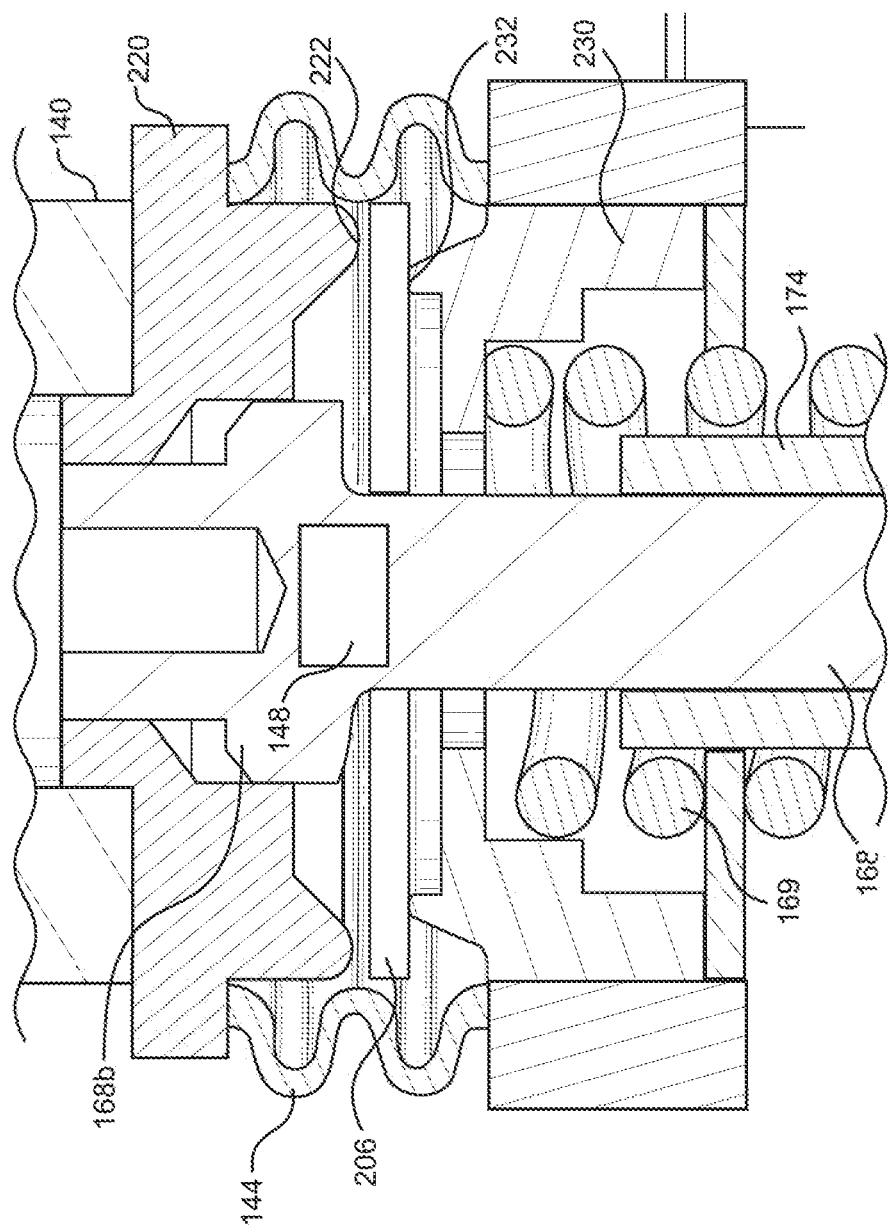

SYSTEM AND METHOD FOR JETTING DISPENSER POSITIONAL CONTROL

CROSS REFERENCE TO RELATED APPLICATIONS

This application is a National Stage Application of International Patent App. No. PCT/US2019/038968, filed Jun. 25, 2019, which claims the benefit of U.S. Provisional Patent App. No. 62/689,694, filed Jun. 25, 2018, the entire disclosures of both of which are hereby incorporated by reference as if set forth in their entirety herein.

TECHNICAL FIELD

This disclosure generally relate, to jetting systems, and more particularly relates to closed-loop feedback control for controlling the position of a needle in a jetting system.

BACKGROUND

Known jetting systems for jetting fluid materials such as adhesives, solder paste, conformal coatings, encapsulants, underfill material, and surface mount adhesives generally operate to jet small volumes of fluid material onto a substrate by reciprocating a needle. One method of actuating the needle is through a piezoelectric device, which provides a high level of control and quick response to changes in operation. During jetting operations, upon each down stroke, the needle contacts a valve seat to create a distinct, high pressure pulse that jets a small amount of a material from a nozzle of the jetting system. The reciprocal movement of the needle must be precise to maintain a jetted dot of material having specific size and shape qualities that suit a particular purpose.

Maintaining consistent reciprocal needle movement over time can be difficult, as each combination of a particular jetting operation, dispensed material, and jetting system can require a unique needle movement pattern. In some instances, the size and shape of a jetted dot of material may stray from the intended values over time. This may be in part to material wear, environmental changes, part tolerances, part replacement, etc. Without accounting for these changes, undesirable fluid patterns may be applied, which can provide an unacceptable end product.

As a result, there is a need for a system that allows for dynamic correction of needle stroke to provide for a consistent dot size and shape of jetted material.

SUMMARY

An embodiment of the present disclosure is a method of controlling movement of a moving part of an applicator for jetting material from the applicator. The method includes actuating a piezoelectric device operatively connected to a needle by providing a voltage waveform to the piezoelectric device, such that the moving part translates along a positional path in a first dispensing operation. The method also includes sensing a position of the moving part over a period of time, wherein the positions define a time-dependent positional profile of the moving part, receiving parameters for a second dispensing operation, and determining, based on the parameters for the second dispensing operation and parameters based on the time-dependent positional profile of the moving part, a required voltage waveform to be applied to the piezoelectric device to perform the second dispensing operation. The method also includes applying the required voltage waveform to the piezoelectric device to perform the second dispensing operation.

Another embodiment of the present disclosure is a method of associating movement of a moving part with voltage applied to an actuator. The method includes providing a voltage waveform to a piezoelectric device operatively connected to the moving part, such that the moving part translates along a positional path in a dispensing operation, and sensing positions of the moving part during the dispensing operation, wherein the positions define a time-dependent positional profile of the moving part. The method also includes generating a relationship between the time-dependent positional profile of the moving part and the voltage waveform applied to the piezoelectric device.

A further embodiment of the present disclosure is an applicator for jetting material. The applicator includes a valve including a valve seat and a needle configured to translate between a first position and a second position in a dispensing operation for jetting material from the valve. The applicator also includes a piezoelectric device for moving the needle in response to receiving a voltage, an amplifier operatively connected between the piezoelectric device and the needle, and a position sensor for monitoring positions of a moving part, wherein the positions define a time-dependent positional profile of the moving part, where the moving part comprises the needle, the amplifier, or a push rod operatively connected to the amplifier. The applicator further includes a controller in electrical communication with the piezoelectric device and the position sensor, wherein the controller is configured to determine a relationship between the time-dependent positional profile of the moving part and the voltage waveform applied to the piezoelectric device.

BRIEF DESCRIPTION OF THE DRAWINGS

The foregoing summary, as well as the following detailed description, will be better understood when read in conjunction with the appended drawings. The drawings show illustrative embodiments of the disclosure. It should be understood, however, that the application is not limited to the precise arrangements and instrumentalities shown.

FIG. 7 is a cross sectional view of a portion of the applicator shown in FIG. 6, taken along line 7-7 of FIG. 6;

FIG. 8 is an enlarged portion of the cross sectional view of the applicator shown in FIG. 7;

DETAILED DESCRIPTION OF ILLUSTRATIVE EMBODIMENTS

Figure 1:
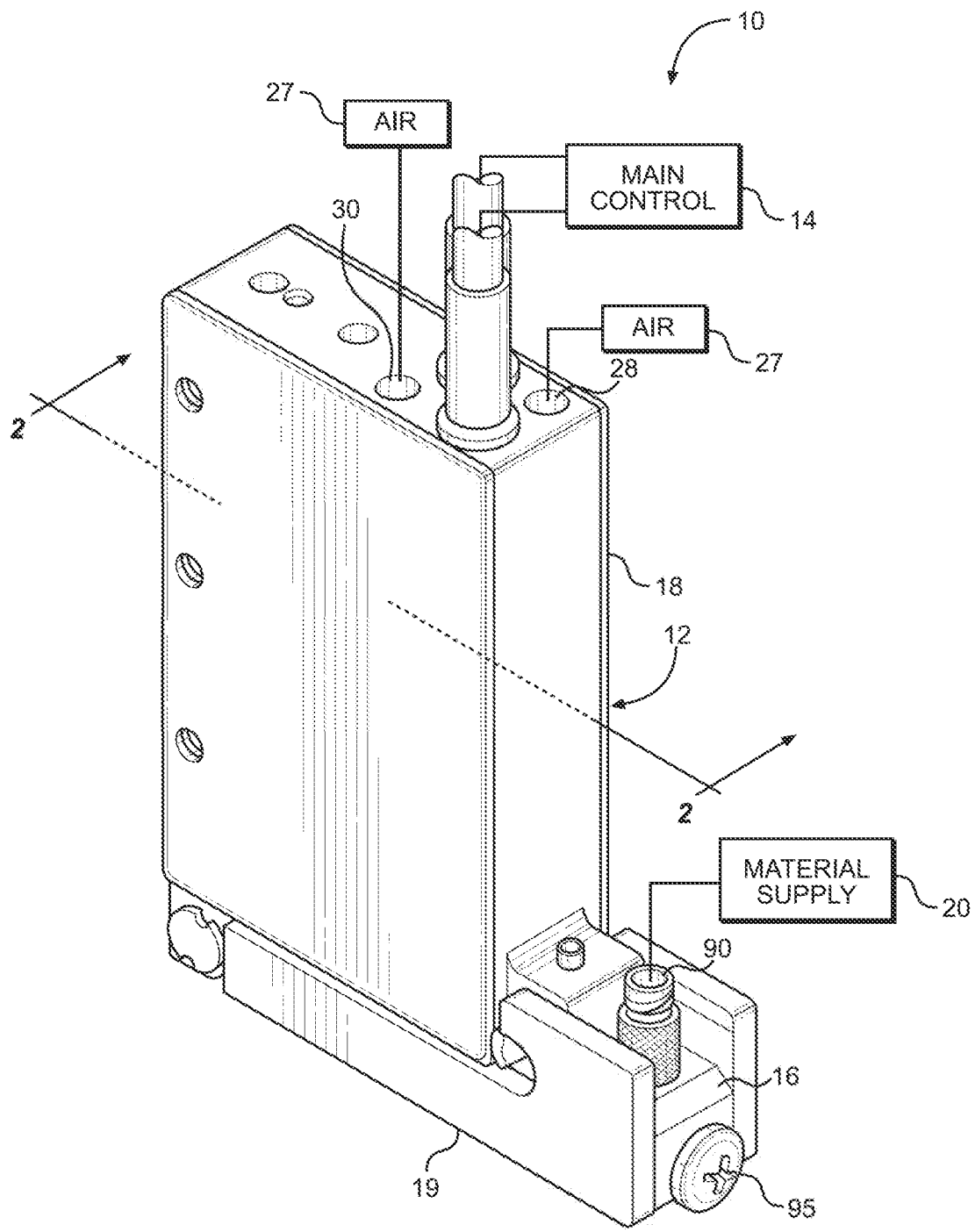
FIG. 1 is a perspective view of an applicator according to an illustrative embodiment of the invention.

Referring to FIGS. 1-4, an applicator 10 in accordance with an embodiment of the invention generally comprises a jetting dispenser 12 coupled with a controller 14. The jetting dispenser 12 includes a fluid body 16 coupled to an actuator housing 18. More specifically, the fluid body 16 is held within a fluid body housing 19, which may include one or more heaters (not shown), depending on the needs of the jetting operation. The fluid body 16 receives material under pressure from a suitable material supply 20, such as a syringe barrel (not shown). A valve assembly 22 is coupled to the housing 18 and extends into the fluid body 16. A mechanical amplifier (e.g., a lever 24) is coupled between a piezoelectric device 26 and the valve assembly 22, as will be described further below.

Figure 2:
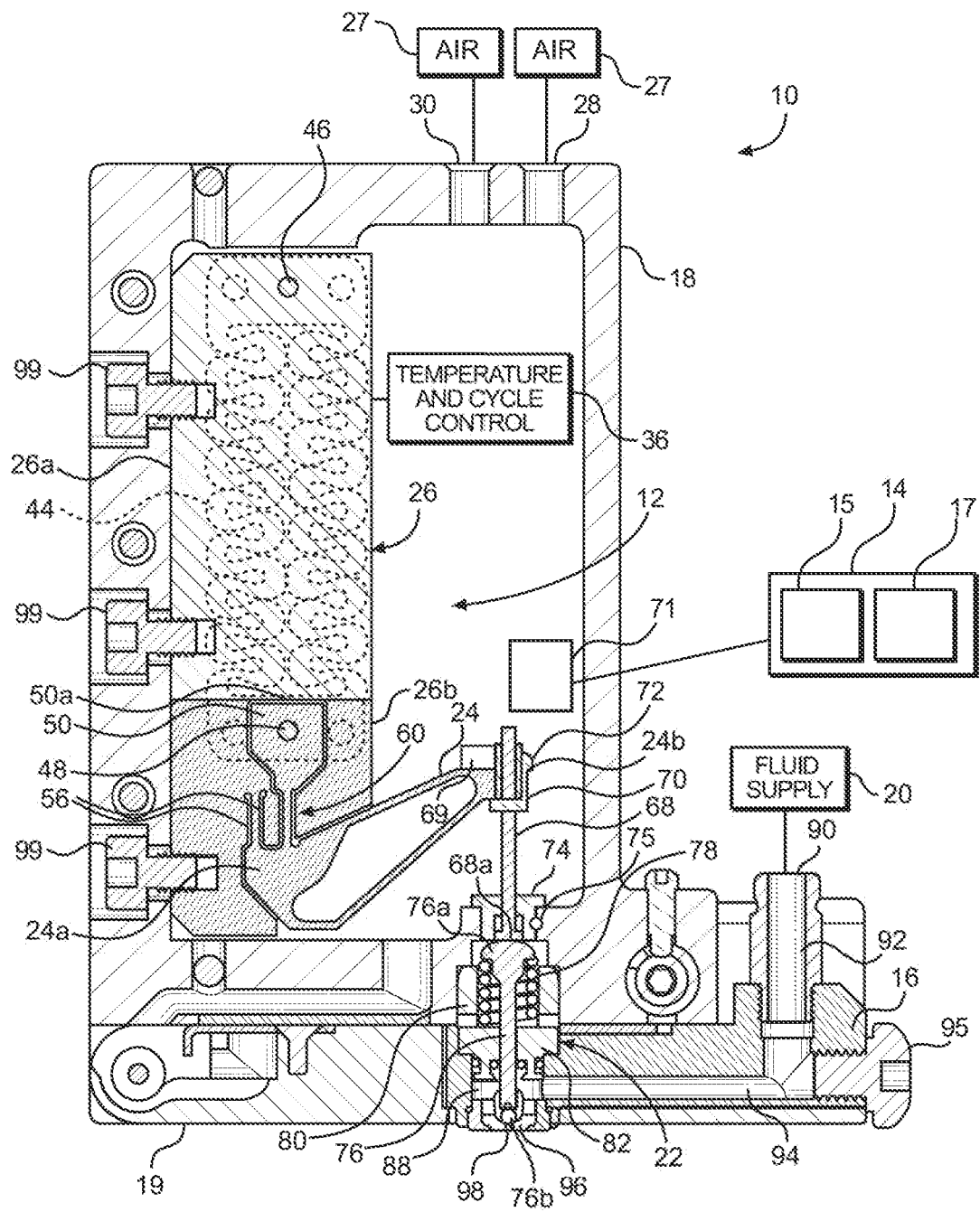
FIG. 2 is a cross sectional view of the applicator shown in FIG. 1, taken along line 2-2 of FIG. 1.

For purposes of cooling the piezoelectric device 26, air may be introduced from a source 27 into an inlet port 28 and out from an exhaust port 30. Alternatively, depending on the cooling needs, both of the inlet and exhaust ports 28, 30 may receive cooling air from the source 27 as shown in FIG. 2. In such a case, one or more other exhaust ports (not shown) would be provided in the housing 18. A temperature and cycle control 36 is provided for cycling the piezoelectric device 26 during a jetting operation, and for controlling one or more heaters (not shown) carried by the jetting dispenser 12 for maintaining the dispensed materials at a required temperature. As another option, the temperature and cycle control 36, or another control, may control the cooling needs of the piezoelectric device 26 in a closed loop manner. As further shown in FIG. 4, the piezoelectric device 26 further comprises a stack 40 of piezoelectric elements. This stack 40 is maintained in compression by respective flat compression spring elements 42, 44 coupled on opposite sides of the stack 40. More specifically, upper and lower pins 46, 48 are provided that hold the flat spring elements 42, 44 to one another with the stack 40 of piezoelectric elements therebetween. The upper pin 46 is held within an upper actuator portion 26a of the piezoelectric device 26, while a lower pin 48 directly or indirectly engages a lower end of the stack 40. The upper actuator portion 26a securely contains the stack 40 of piezoelectric elements so that the stack 40 is stabilized against any sideward motion. In this embodiment, the lower pin 48 is coupled to a lower actuator portion 26b and, more specifically, to a mechanical armature 50 (FIG. 2).

An upper surface 50a of the mechanical armature 50 bears against the lower end of the piezoelectric stack 40. The spring elements 42, 44 are stretched between the pins 46, 48 such that the spring elements 42, 44 apply constant compression to the stack 40 as shown by the arrows 53 in FIG. 4. The flat spring elements 42, 44 may, more specifically, be formed from a wire EDM process. The upper end of the piezoelectric element stack 40 is retained against an internal surface of the upper actuator portion 26a. The upper pin 46 is therefore stationary while the lower pin 48 floats or moves with the spring elements 42, 44 and with the mechanical armature 50 as will be described. When a voltage waveform is applied to the piezoelectric stack 40, the stack 40 expands or lengthens and this moves the armature 50 downward against the force of the spring elements 42, 44. The stack 40 will change length proportional to the magnitude of the applied voltage waveform over time.

As further shown in FIG. 2, the mechanical armature 50 is operatively coupled with a mechanical amplifier which, in this illustrative embodiment, is formed as the lever 24 coupled to the mechanical armature 50 generally near a first end 24a and coupled to a push rod 68 at a second end 24b. The lever 24 may be integrally formed from the lower actuator portion 26b through, for example, an EDM process that also forms a series of slots 56 between the mechanical armature 50 and the lever 24. As will be further discussed below, the lever 24 or another mechanical amplifier amplifies the distance that the stack 40 expands or lengthens by a desired amount. For example, in this embodiment, downward movement of the stack 40 and the mechanical armature 50 is amplified by about eight times at the second end 24b of the lever 24.

Now referring more specifically to FIGS. 2, 2A, 2B and 5, a flexural portion 6A) couples the lever 24 to the mechanical armature 50. As shown best in FIG. 5, the lever 24 pivots about a pivot point 62 that is approximately at the same horizontal level as the second end 24b of the lever 24. This position of the pivot point 62 serves to minimize the effect of the arc through which the lever 24 rotates. The series of slots 56 is formed in the lower actuator portion 26b form the flexural portion 60. When the piezoelectric stack 40 lengthens under the application of a voltage waveform by the controller 14 as shown by the arrow 66 in FIG. 5, the lever 24 rotates clockwise generally about the pivot point 62 as the stack 40 pushes downward on the mechanical armature 50. The slight rotation of the lever 24 takes place against a resilient bias applied by the flexural portion 60. As the second end 24b is rotating slightly clockwise about the pivot point 62, it moves downward and likewise moves an attached push rod 68 downward (FIG. 2) as indicated by the arrow 67 in FIG. 5.

The controller 14 can comprise any suitable computing device configured to host a software application for monitoring and controlling various operations of the applicator 10 as described herein. It will be understood that the controller 14 can include any appropriate computing device, examples of which include a processor, a desktop computing device, a server computing device, or a portable computing device, such as a laptop, tablet, or smart phone. Specifically, the controller 14 can include a memory 15 and an HMI device 17. The memory 15 can be volatile (such as some types of RAM), non-volatile (such as ROM, flash memory, etc.), or a combination thereof. The controller 14 can include additional storage (e.g., removable storage and/or non-removable storage) including, but not limited to, tape, flash memory, smart cards, CD-ROM, digital versatile disks (DVD) or other optical storage, magnetic tape, magnetic disk storage or other magnetic storage devices, universal serial bus (USB) compatible memory, or any other medium which can be used to store information and which can be accessed by the controller 14. The HMI device 17 can include inputs that provide the ability to control the controller 14, via, for example, buttons, soft keys, a mouse, voice actuated controls, a touch screen, movement of the controller 14, visual cues (e.g., moving a hand in front of a camera on the controller 14), or the like. The HMI device 17 can provide outputs, via a graphical user interface, including visual information, such as the visual indication of the current position and velocity values of the needle 76, as well as acceptable ranges for these parameters via a display. Other outputs can include audio information (e.g., via speaker), mechanically (e.g., via a vibrating mechanism), or a combination thereof. In various configurations, the HMI device 17 can include a display, a touch screen, a keyboard, a mouse, a motion detector, a speaker, a microphone, a camera, or any combination thereof. The HMI device 17 can further include any suitable device for inputting biometric information, such as, for example, fingerprint information, retinal information, voice information, and/or facial characteristic information, for instance, so as to require specific biometric information for accessing the controller 14.

Figure 2A:
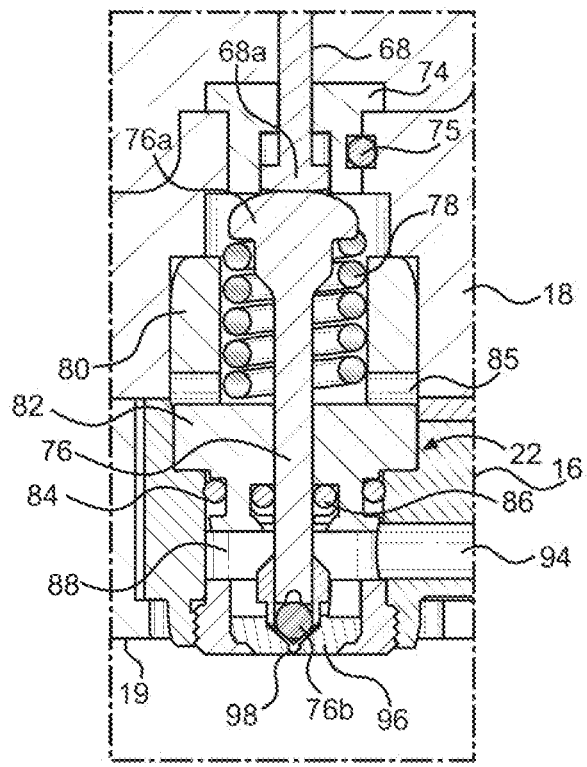
FIG. 2A is an enlarged cross sectional view of the valve assembly of the applicator shown in FIG. 2, showing the needle in a first position.
Figure 2B:
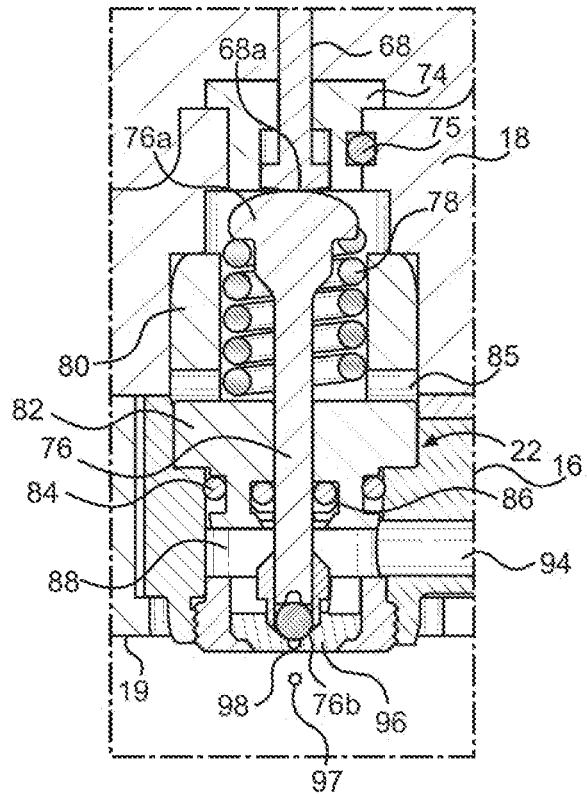
FIG. 2B is an enlarged cross sectional view of the valve assembly shown in FIG. 2A, with the needle in a second position.

The second end 24b of the lever 24 is fixed to the push rod 68 using suitable threaded fasteners 70, 72. The push rod 68 has a lower head portion 68a that travels within a guide bushing 74 and bears against an upper head portion 76a of a needle 76 of the valve assembly 22. The guide bushing 74 is held in the housing 18 by a press fit with a pin 75 as best seen in FIGS. 2A and 2B. The assembly of the push rod 68, guide bushing 74 and pin 75 allows for some "give" to ensure proper movement of the push rod 68 during operation. In addition, the push rod 68 is made of a material that will slightly bend sideward, in an elastic manner, during its reciprocating movement with the needle 76 and lever 24. The valve assembly 22 further comprises a coil spring 78 which is mounted within a lower portion of the actuator housing 18 using an annular element 80. The valve assembly 22 further comprises an insert 82 retained in the fluid body 16 by an O-ring 84. The annular element 80 and the insert 82 comprise an integral element, i.e., a cartridge body in this embodiment. A cross-drilled weep hole 85 is approximately in line with the lower end of the spring 78 to allow any liquid that leaks past the O-ring 86 to escape. An additional O-ring 86 seals the tappet or needle 76 such that pressurized material contained in a fluid bore 88 of the fluid body 16 does not leak out. Material is supplied to the fluid bore 88 from the fluid supply 20 through an inlet 90 of the fluid body 16 and passages 92, 94. The O-ring 84 seals the outside of the cartridge body formed by the annular element 80 and insert 82 from the pressurized liquid in bore 88 and passage 94. The fluid passages 92, 94 are sealed by a plug member 95 threaded into the fluid body 16. The plug member 95 may be removed to allow access for cleaning the internal passage 94.

Referring to FIGS. 2 and 3-5, the applicator 10 can include a reference component 69 attached to the lever 24 near the second end 24b, as well as a position sensor 71 disposed within the actuator housing 18. The position sensor 71 is configured to detect and monitor the position of the reference component 69 as the lever 24 pivots upon lengthening and contraction of the piezoelectric stack 40. The position sensor 71 is in electronic communication with the controller 14, and can continuously or periodically monitor and communicate the position of the reference component 69 to the controller 14. By monitoring the position of the reference component 69, the position sensor 71 also monitors the position of the lever 24 to which the reference component 69 is attached during a dispensing operation. In one embodiment, the reference component 69 is a magnet and the position sensor 71 is a Hall effect sensor, though other configurations are also contemplated. Also, although the reference component 69 is depicted as attached to the lever 24, the reference component 69 can be attached to any of the lever 24, the push rod 68, or the needle 76. The lever 24, push rod 68, and the needle 76 can collectively be referred to as the "moving parts" of the actuator. As the reference component 69 can be differently positioned, the position sensor 71 can similarly be repositioned within the actuator housing 18 so as to best monitor the position of the reference component 69. The method for using the position sensor 71 and reference component 69 to control the applicator 10 will be described further below.

Figure 3:
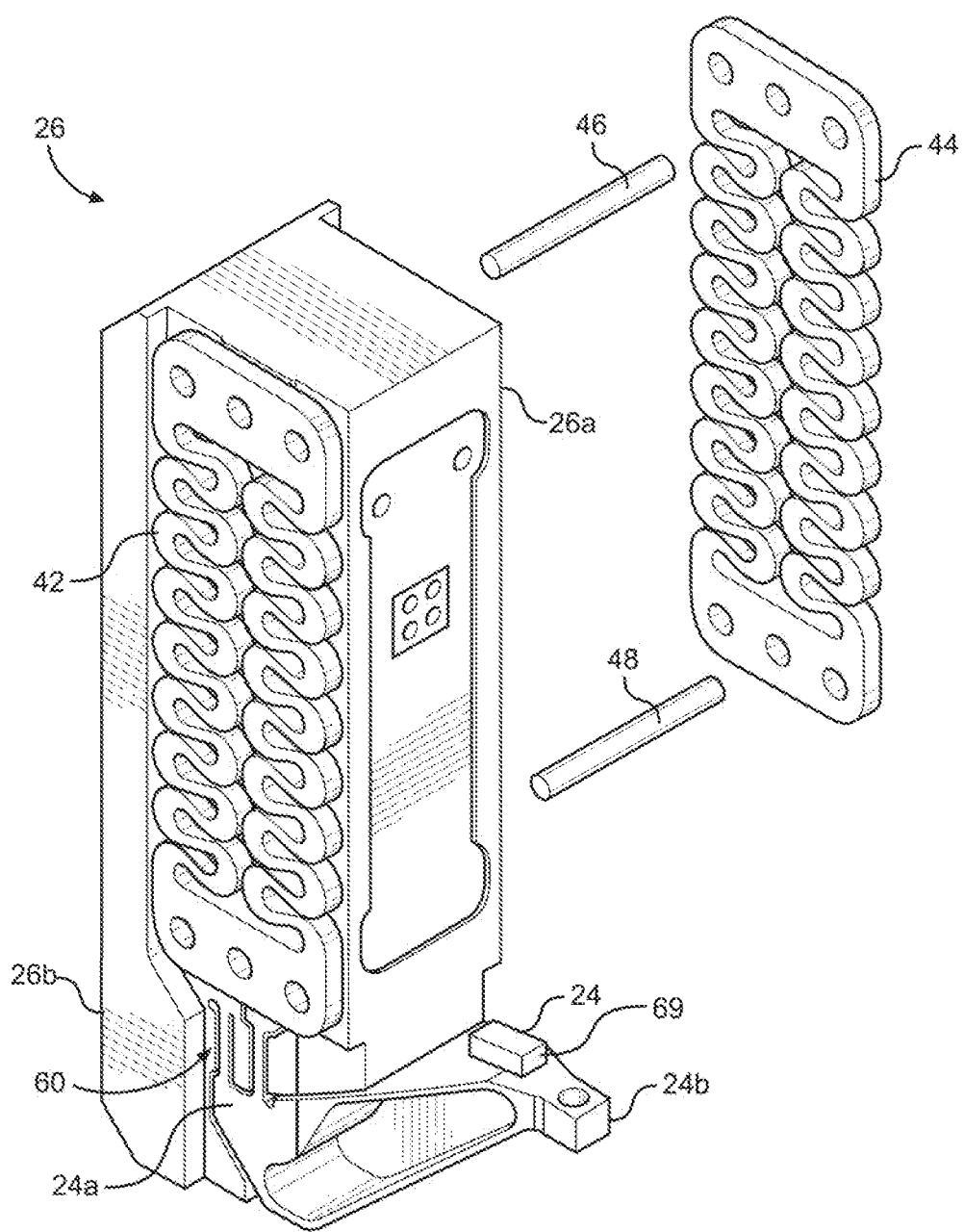
FIG. 3 is a partially exploded perspective view of a piezoelectric device of the applicator shown in FIG. 1.
Figure 4:
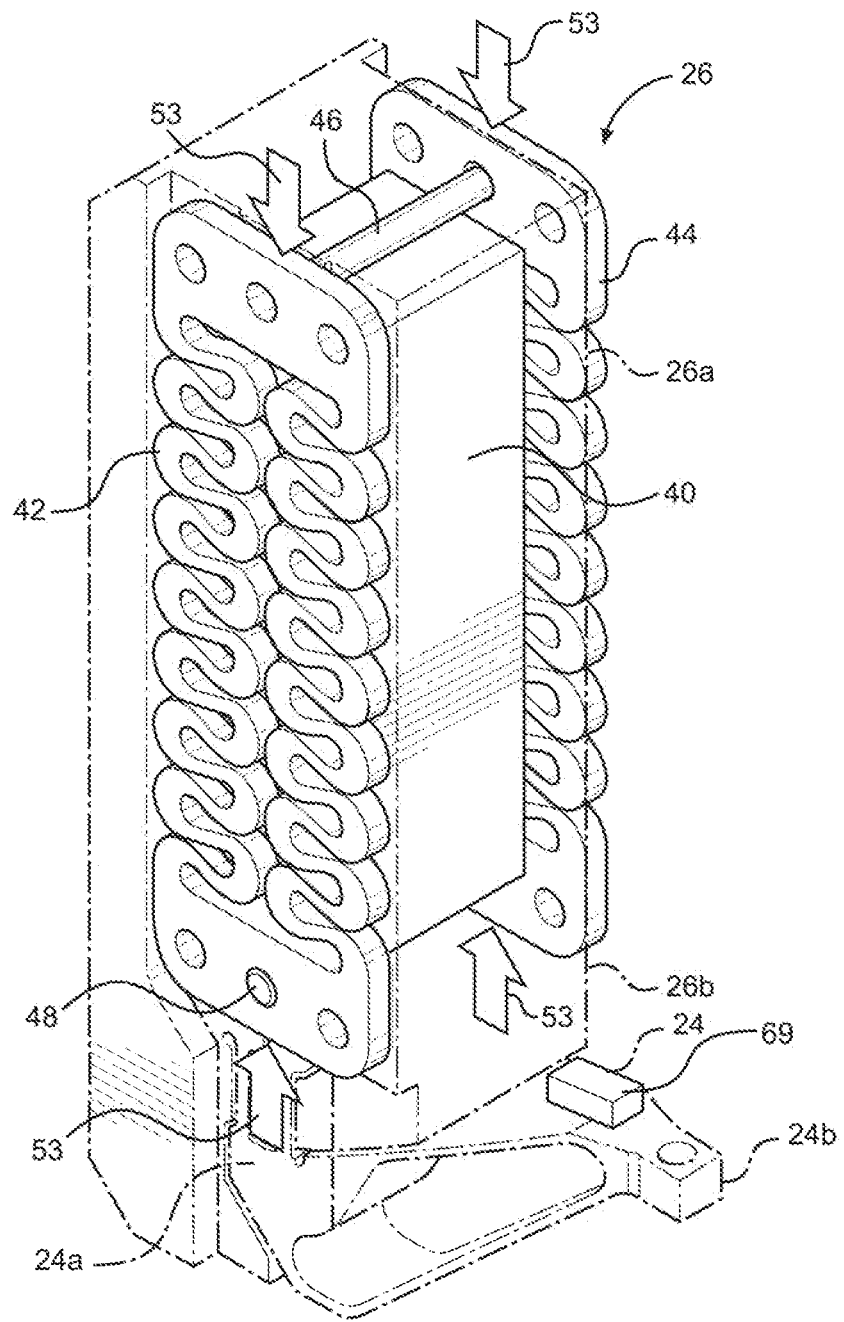
FIG. 4 is a perspective view of the piezoelectric device shown in FIG. 3, with certain elements shown in dashed lines to better show inner details.
Figure 5:
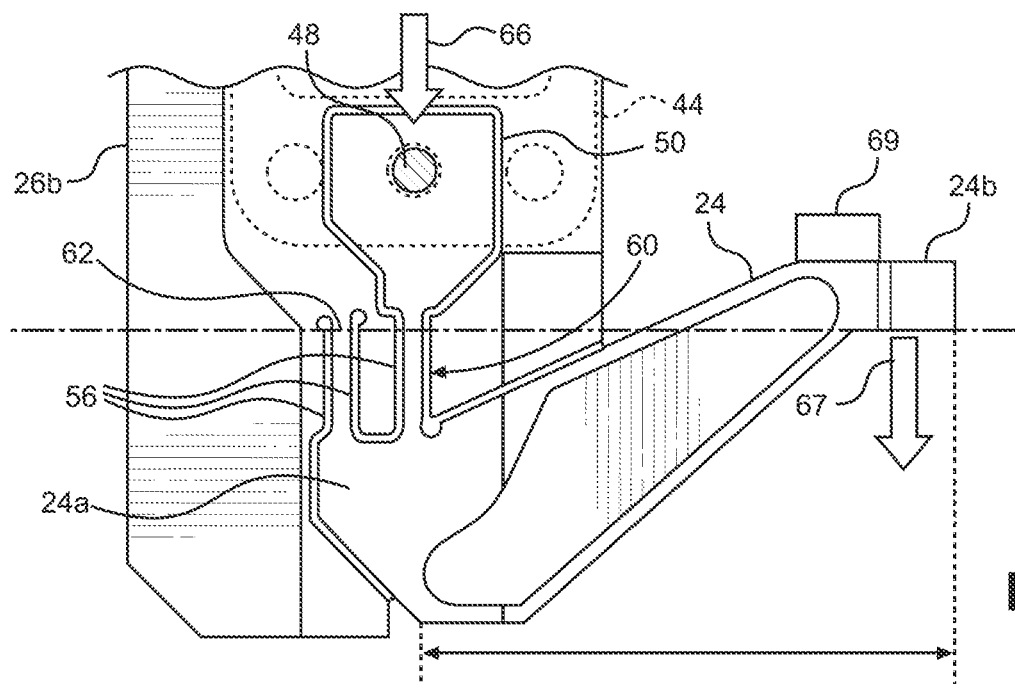
FIG. 5 is a side elevational view of a lower portion of the piezoelectric device shown in FIG. 3.
Figure 6:
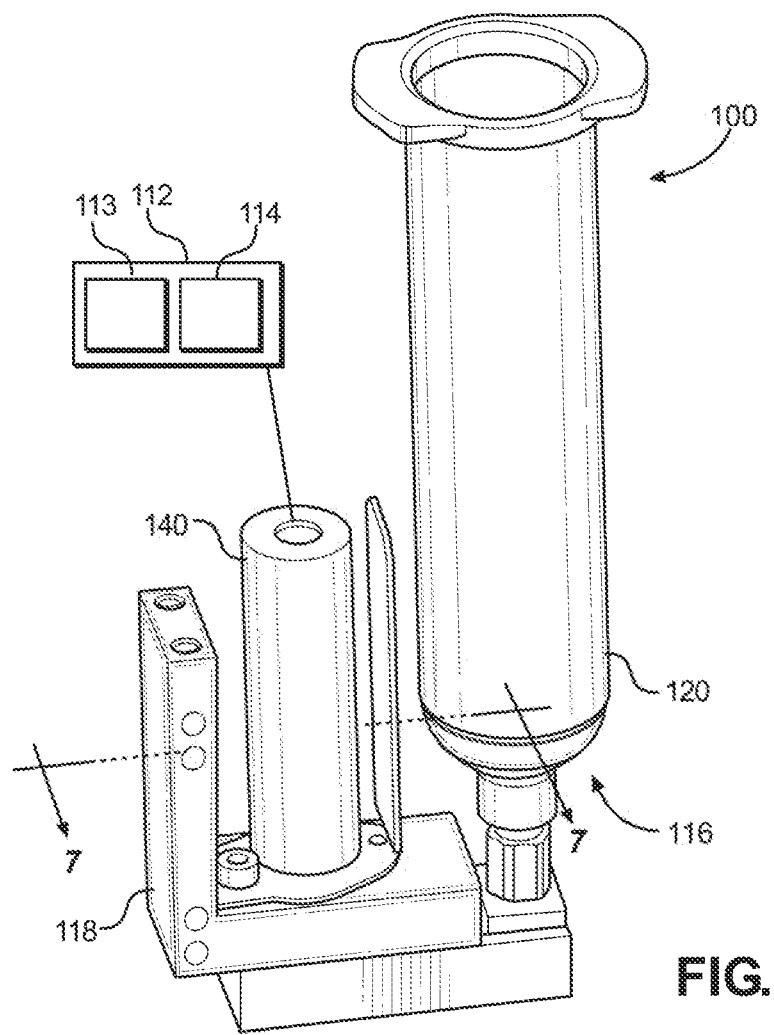
FIG. 6 is an isometric view of an applicator according to an alternative embodiment of the present disclosure.

The operation of the applicator 10 to jet droplets or small amounts of material will be best understood by reviewing FIGS. 2-4. FIG. 2A illustrates the needle 76 raised to a retracted first position when the voltage waveform to the piezoelectric stack 40 has been sufficiently removed. This causes the stack 40 to contract. As the stack 40 contracts, the flat spring elements 42, 44 pull the armature 50 upward and this raises the second end 24b of the lever 24, and also raises the push rod 68. Thus, the coil spring 78 of the valve assembly 22 can then push upward on the upper head portion 76a of the needle 76 and raise a distal end 76b of the needle 76 off a valve seat 96 affixed to the fluid body 16. In this position, the fluid bore 88 and the area beneath the distal end 76b of the needle 76 fills with additional material to "charge" the jetting dispenser 12 and prepare the jetting dispenser 12 for the next jetting cycle.

When the piezoelectric stack 40 is activated, i.e., when a voltage waveform is applied to the piezoelectric stack 40 by the controller 14 (FIG. 1), the stack 40 expands and pushes against the mechanical armature 50. This rotates the lever 24 clockwise and moves the second end 24b downward, also moving the push rod 68 downward. The lower head portion 68a of the push rod 68 pushes down on the upper head portion 76a of the needle 76 as shown in FIG. 2B and the needle 76 moves quickly downward against the force of the coil spring 78 until the distal end 76b engages against the valve seat 96 in a second position. In the process of movement, the distal end 76b of the needle 76 forces a droplet 97 of material from a discharge outlet 98. Voltage is then removed from the piezoelectric stack 40 and this reverses the movements of each of these components to raise the needle 76 for the next jetting cycle. In some embodiments, the needle 76 can move quickly downward against the force of the coil spring 78 until the distal end 76b comes close to but does not contact the valve seat 96 in the second position to force a droplet 97 of material from the discharge outlet 98. The benefit of not contacting the distal end 76b of the needle 76 with the valve seat 96 is to prevent wear or damage to either or both of those components in a manner that alters the dispensing characteristics of the applicator 10.

It will be appreciated that the piezoelectric device 26 may be utilized in reverse to jet droplets. In this case, the various mechanical actuation structures including the lever 24 would be designed differently such that when the voltage is removed from the piezoelectric stack 40, the resulting contraction of the stack 40 will cause movement of the needle 76 toward the valve seat 96 and the discharge outlet 104 to discharge a droplet 97 of material. Then, upon application of the voltage waveform to the stack 40, the amplification system and other actuation components would raise the needle 76 in order to charge the fluid bore 88 with additional material for the next jetting operation. In this embodiment, the needle 76 would be normally closed, that is, it would be engaging the valve seat 96 when there is no voltage applied to the piezoelectric stack 40.

As further shown in FIG. 2, the upper actuator portion 26a is separate from the lower actuator portion 26b and these respective portions 26a, 26b are formed from different materials. Specifically, the upper actuator portion 26a is formed from a material having a lower coefficient of thermal expansion than the material forming the lower actuator portion 26b. Each of the upper and lower actuator portions 26a, 26b is securely fastened together using threaded fasteners (not shown) extending from the lower actuator portion 26b into the upper actuator portion 26a. The assembly of the upper and lower actuator portions 26a, 26b is then fastened to the housing by a plurality of bolts 99. More specifically, the lower actuator portion 26b may be formed from PH17-4 stainless steel, while the upper actuator portion 26a may be formed from a nickel-iron alloy, such as Invar. 17-4 PH stainless steel has a very high endurance limit, or fatigue strength, which increases the life of flexural portion 60. The coefficient of thermal expansion of this stainless steel is about 10 μm/m-C, while the coefficient of thermal expansion of Invar is about 1 μm/m-C. The ratio of the thermal expansions may be higher or lower than the approximate 10:1 ratio of these materials. The coefficients of thermal expansion associated with the upper and lower actuator portions 26a, 26b effectively provide offsetting characteristics to each other. The differing coefficients of thermal expansion of the upper and lower actuator portions 26a, 26b thereby allow the piezoelectric actuator 26 to operate consistently across a wider temperature range. Specifically, this temperature range allows the piezoelectric actuator 26 to be run at higher frequencies and with more aggressive waveforms. Also, piezo stacks, when operated at a high duty cycle, can generate significant heat. Use of Invar provides for more absolute positioning of the end of the piezoelectric actuator 26, and hence more accurate and useable stroke.

Referring to FIGS. 6-14, another embodiment of an applicator for jetting a material onto a substrate is shown. The applicator 100 is shown having a fluid body 116 coupled to an actuator housing 118. The fluid body 116 is held within a fluid body housing 119, which may include one or more heaters (not shown), depending on the needs of the application. The fluid body 116 is configured to receive material under pressure from a suitable fluid supply 120, such as a syringe barrel. A valve assembly 122 is coupled to the actuator housing 118 and extends into the fluid body 116. A mechanical amplifier 206 is coupled between a piezoelectric device 126 and the valve assembly 122, as will be described further below. The piezoelectric device 126 may be fastened to the actuator housing 118 by a plurality of bolts (not shown) or other suitable fasteners. The piezoelectric device 126 may include various materials, for example, but not limited to, stainless steel or a nickel-iron alloy.

As further shown in FIGS. 7-8, the piezoelectric device 126 includes a stack 140 of piezoelectric elements, a proximal end 218, and a distal end 220 opposite the proximal end 218. The piezoelectric elements are configured to deform upon application and/or removal of a voltage waveform. This stack 140 is maintained in compression by a compression spring 144 coupled to the piezoelectric device 126.

The stack 140 may be held in compression between the compression spring 144 at the distal end 220 and a rigid surface (not shown), for example, against an internal surface of the housing 18. The rigid surface may contact the proximal end 218. In some aspects, the stack 140 may be held by a plurality of compression springs 144, for example, a first compression spring 144 at the proximal end 218 and a second compression spring 144 at the distal end 220.

Figure 9A:
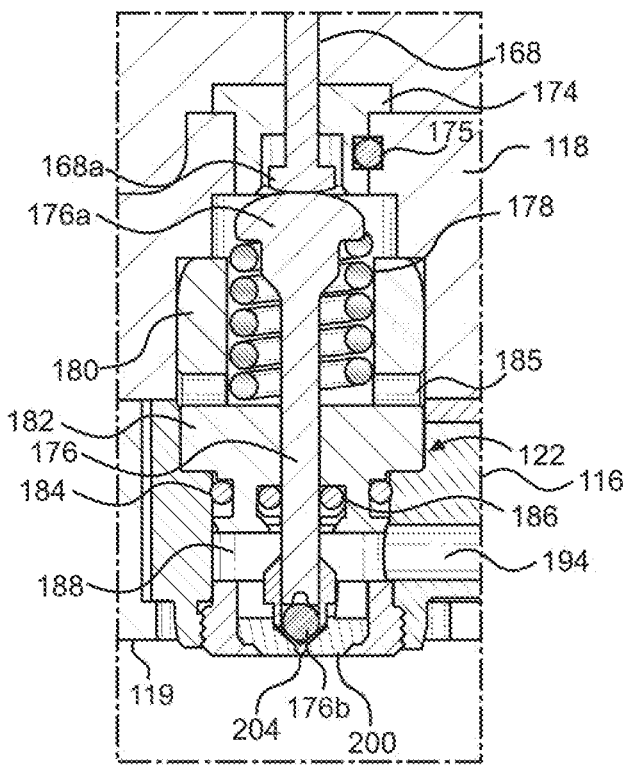
FIG. 9A is an enlarged portion of the cross sectional view of a valve assembly of the applicator shown in FIG. 6, with a needle in a first position.
Figure 9B:
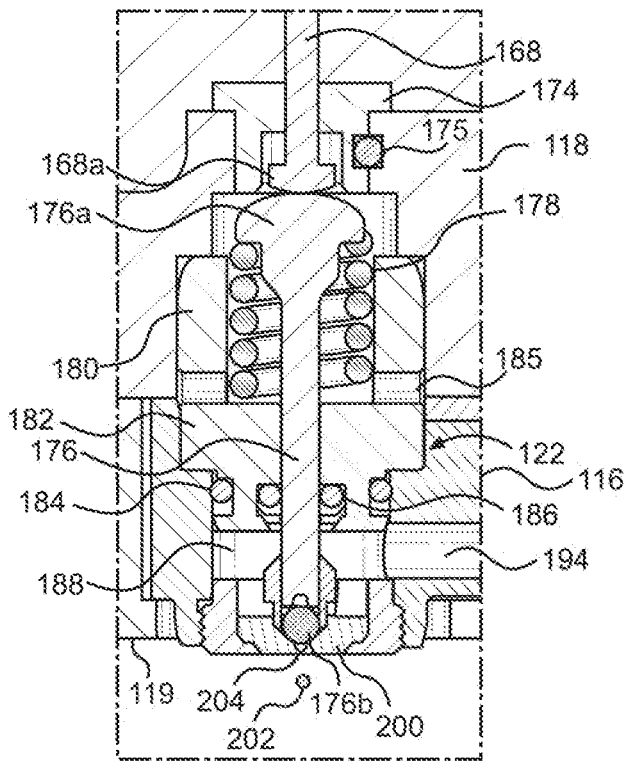
FIG. 9B is an enlarged cross sectional view of the valve assembly shown in FIG. 9A, with the needle in a second position.

The piezoelectric device 126 is operatively engaged with a push rod 168 and is configured to move the push rod 168 in a first direction. Referring to FIGS. 9A-9B, the push rod 168 has a lower head portion 168a that travels within a guide bushing 174 and bears against a proximal end 176a of a needle 176 associated with the valve assembly 122, wherein the needle 176 may be a movable shaft. The guide bushing 174 may be held in the actuator housing 118 by a press fit with a pin 175. The assembly of the push rod 168, guide bushing 174 and pin 175 allows for some "give" to ensure proper movement of the push rod 168 during operation.

The valve assembly 122 may further comprise a coil spring 178 that is mounted within a lower portion of the actuator housing 118 using an annular element 180. An insert 182 may be retained in the fluid body 116 by an O-ring 184. The annular element 180 and the insert 182 comprise an integral element, i.e., a cartridge body in the depicted aspect.

An additional O-ring 186 seals the needle 176 such that pressurized material contained in a fluid bore 188 of the fluid body 116 does not leak out. Material is supplied to the fluid bore 188 from the fluid supply 120 through an inlet 190 of the fluid body 116 and passages 192, 194. The O-ring 184 seals the outside of the cartridge body formed by the annular element 180 and insert 182 from the pressurized liquid in fluid bore 188 and passage 194. A cross-drilled weep hole 185 is approximately in line with the lower end of the coil spring 178 to allow any liquid that leaks past the O-ring 186 to escape.

When the voltage waveform is applied to the stack 140, the piezoelectric elements deform, and the stack 140 expands or lengthens, causing the distal end 220 to move in a direction away from the proximal end 218 against the force exerted by the spring 144. The stack 140 may be configured to change length in proportion to the magnitude of the voltage waveform applied thereto over time. When the applied voltage is removed or sufficiently reduced, the stack 140 contracts or shortens to substantially the same length as it was before the application of the voltage.

The movement of the stack 140 causes movement of the push rod 168 operatively coupled to the piezoelectric device 126. The push rod 168 may be operatively coupled to a needle 176 disposed on the valve assembly 122. As the push rod 168 is moved, the needle 176 also moves to open or close a discharge outlet 204 on the valve assembly 122. Repeated movement of the stack 140 results in reciprocal movement of the needle 176 and causes droplets or small amounts of material to be dispensed or jetted through the discharge outlet 204 of the applicator 100. In some embodiments, the needle 176 can move quickly downward until the needle 176 comes close to but does not contact the discharge outlet 204.

Referring again to FIGS. 7-8, a mechanical amplifier 206 may be disposed within the applicator 100 to proportionally amplify the movement of the stack 140. The amplifier 206 is coupled to the stack 140 and to the valve assembly 122, such that movement of the stack 140 causes at least a portion of the amplifier 206 to move, which in turn causes the needle 176 to move. When the voltage waveform is applied to the stack 140, movement of the stack 140 imparts a force onto the amplifier 20 and causes the amplifier 206 to move as well and to move the needle 176. It will be appreciated that if amplification of the original movement is desired, the magnitude of the movement of the needle 176 by the amplifier 206 will be greater than the magnitude of the movement of the stack 140.

Figure 10:
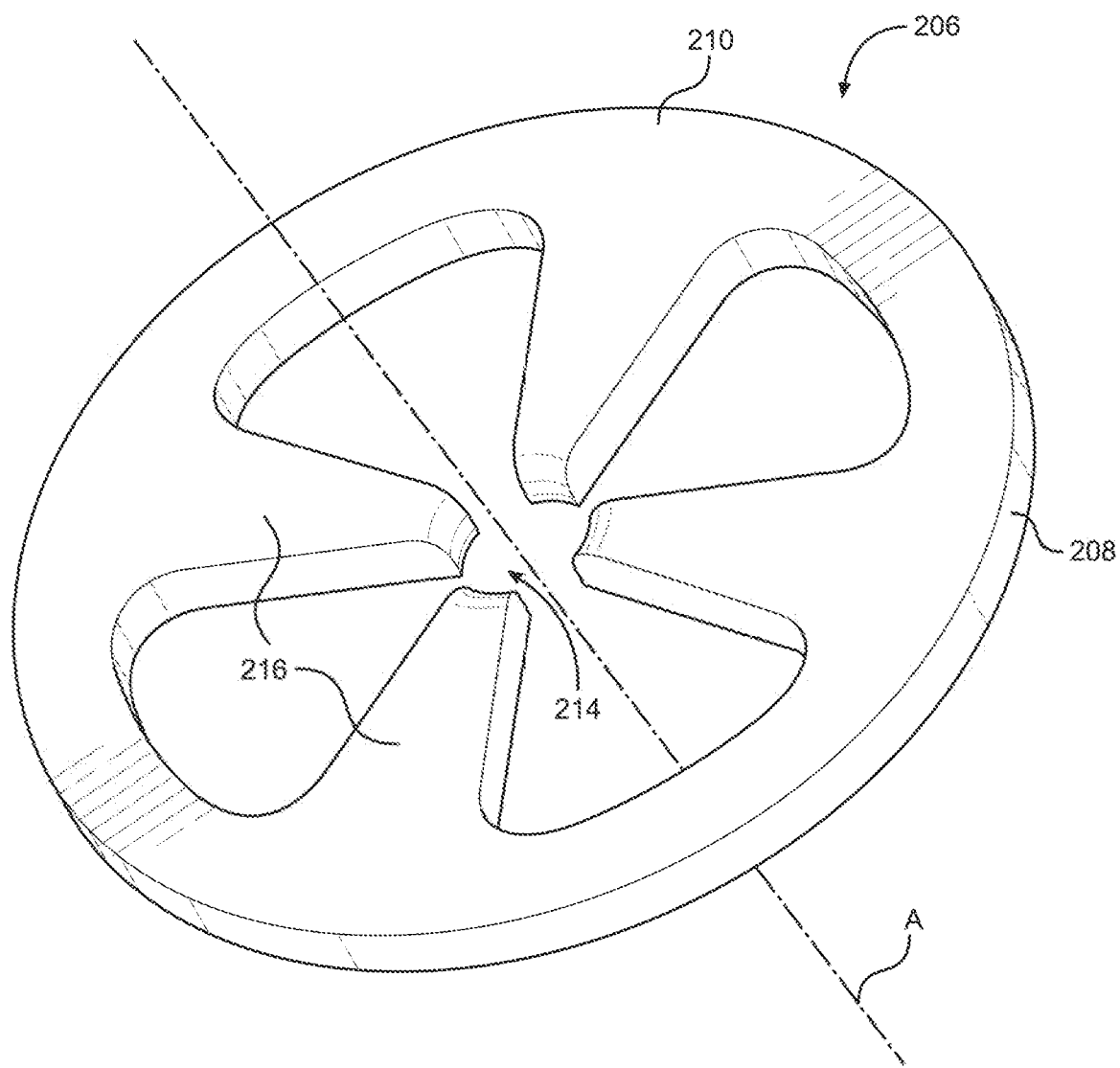
FIG. 10 is an isometric view of a mechanical amplifier of the valve assembly shown in FIG. 9A.
Figure 11:
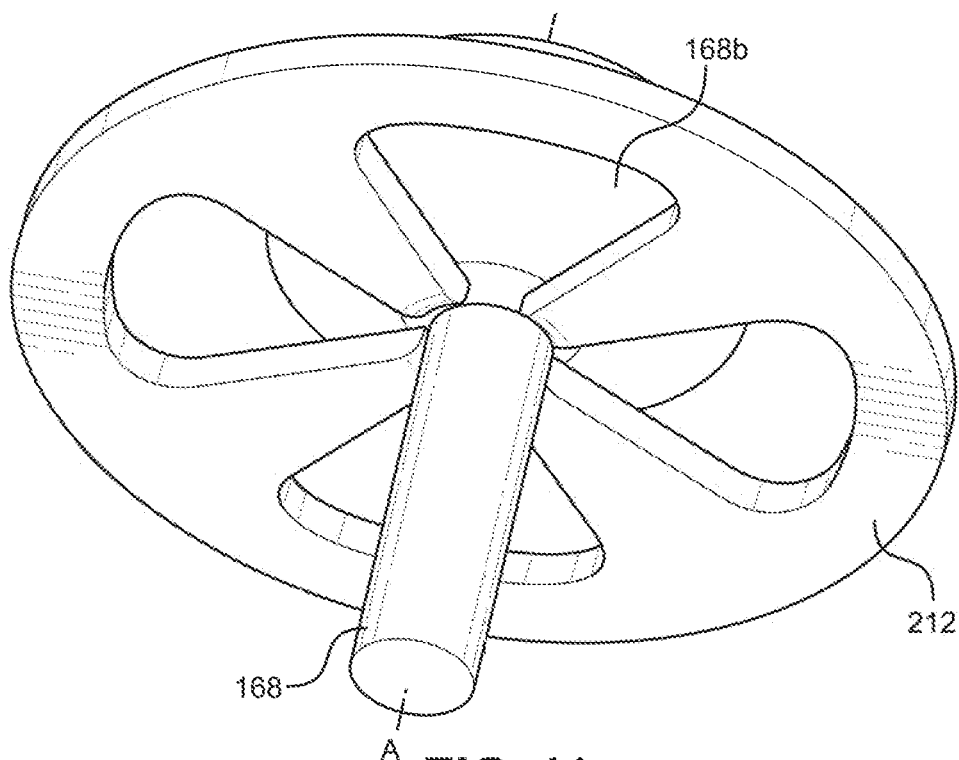
FIG. 11 is an alternative isometric view of the mechanical amplifier shown in FIG. 10.

Referring to FIGS. 10-11, the amplifier 206 may be a disc having a substantially round cross-section. However, it will be understood that the amplifier 206 may be any suitable shape, for example having rectangular, triangular, or another polygonal cross-sectional shape.

The amplifier 206 may be integral with the applicator 100, being either part of a single unitary component, or a separate component affixed to the applicator 100. In some aspects, the amplifier 206 may be a separate component that is removably coupled to the applicator 100 and is configured to be selectively engaged with or disengaged from the stack 140 and the valve assembly 122. The applicator 100 may be configured to operate either with an amplifier engaged or without an amplifier engaged. In some aspects, the applicator 100 may include a plurality of amplifiers 206 that can be selectively engaged or disengaged to result in varying degrees of amplification. The applicator 100 may be configured to operate with multiple amplifiers 20 simultaneously engaged. In some aspects, an amplifier 206 may be interchangeable with another amplifier 206 to result in a different degree of amplification.

Referring still to FIGS. 10-11, the amplifier 206 includes a body 208, which has a primary surface 210 and a secondary surface 212 opposite the primary surface 210. The body 208 may comprise a deformable material that can be deformed upon the application of force. The deformable material should be sufficiently resilient so that when the force that causes the deformation is reduced or removed, the body 208 returns substantially to its non-deformed shape. The body 208 should be rigid enough to receive a force from the stack 140 and to impart a force onto the needle 176 without sustaining damage (e.g., without cracking or breaking). It will be understood that no material is perfectly elastic and infinitely durable, and that a person skilled in the art would recognize materials that would perform the desired functions to an adequate degree.

The amplifier 206 may include an opening 214 extending through the body 208 and connecting the primary surface 210 with the secondary surface 212. A central axis A extends through the geometric center of the opening 214. The central axis A may also be common with the central axis of the stack 140 and the push rod 168. In some aspects, one or more lobes 216 may extend radially inward from a circumference of the body 208 into the opening 214 toward the central axis A. The lobes 216 may be substantially perpendicular to the central axis A when the amplifier 206 is not in a deformed configuration. The amplifier 206 may include 2, 3, . . . , 10, or another suitable number of lobes. Alternatively, the amplifier 206 may include zero lobes extending from the body 208 and be donut-shaped.

The amplifier 206 may be operatively coupled to the push rod 168, such that when the amplifier 206 is moved, the push rod 168 also moves. It will be understood that the push rod 168 can be coupled to the amplifier 206 in any suitable manner, for example, via friction fit, using an adhesive, using a fastener, etc. The push rod 168 may alternatively be integrally formed with the amplifier 206. Referring to the aspects depicted in FIG. 11, the push rod 168 may extend through the opening 214 of the amplifier body 208. In such aspects, at least a portion of the push rod 168 should be shaped and dimensioned such that it can freely pass through the opening 214. An upper head portion 168b of the push rod 168 may contact the amplifier 206, for example at the primary surface 210. The upper head portion 168b may be sized and dimensioned larger than the opening 214 such that it is prevented from passing through the opening 214. In some aspects, where the amplifier 206 is deformed, the opening 214 may be larger than it is when the amplifier 206 is not deformed. In such aspects, the upper head portion 168b should be sized to be larger than the opening 214 of the deformed amplifier 206 as well.

The upper head portion 168b is integrally attached to the portion of the push rod 168 that is configured to pass through the opening 214. The amplifier 206 may impart a force onto the upper head portion 168b, which is, in turn, transferred to the rest of the push rod 168.

The amplifier 206 may operate as a lever mechanism to receive a force from the stack 140 and to impart a force onto the push rod 168. The amplifier 206 may be disposed between the distal end 220 of the piezoelectric device 126 and a base 230. Referring again to FIGS. 7-8, the primary surface 210 may be adjacent to the distal end 220, while the secondary surface 212 may be adjacent to the base 230.

In some aspects, to increase precision of the force transfer, the amplifier 206 is contacted by specific contact regions disposed on the distal end 1220 and the base 230. As shown in FIG. 8, for example, a primary protrusion 222 may be disposed on the distal end 220 and extend therefrom in a direction toward the primary surface 210 of the amplifier 206. Similarly, the base 230 may include a secondary protrusion 232 that extends therefrom in a direction toward the secondary surface 212 of the amplifier 206. While the primary protrusion 222 and the secondary protrusion 232 may extend from the distal end 220 and the base 230, respectively, at any acceptable angle, it will be understood that at least a component of the angle of extension should be substantially perpendicular to the primary and secondary surfaces 210, 212, respectively.

In some alternative aspects, the primary protrusion 222 may be integral to and extend from the primary surface 210 of the amplifier body 208 toward the distal end 220. Similarly, the secondary protrusion 232 may be integral to and extend from the secondary surface 212 of the amplifier body 208 toward the base 230. In further aspects, protrusions may extend from one or more of the amplifier 206, the distal end 220, and/or the base 230, and this disclosure is not limited to a particular arrangement of protrusions as described above.

In operation, the applicator 100 is configured to jet droplets or small amounts of material. When the stack 140 is activated, i.e., when a voltage waveform is applied to the piezoelectric elements by the main electronic control (not shown), the stack 140 expands and pushes against the amplifier 206 at the primary surface 210. Based on the position of the primary and secondary protrusions 222, 232 as described above, the amplifier 206 deforms and imparts a force onto the upper head portion 168b of the push rod 168. This forces the push rod 168 to move in an opening direction toward the piezoelectric device 126. The distance the upper head portion 168b is moved by the amplifier 206 is preferably greater than the distance moved by the distal end 220 of the stack 140. The lower head portion 168a, integral to the push rod 168, also moves in the same opening direction. As the lower head portion 168a moves away from the needle 176, the needle 176 is also permitted to move in the opening direction to a first position. The needle 176 may be biased toward the opening direction by a coil spring 178, and when the push rod 168 moves away from the needle 176, the coil spring 178 moves the needle 176 in the opening direction as well.

When voltage is removed or sufficiently reduced from the stack 140, the movements described above are reversed. The stack 140 is reduced in length, thus decreasing the force applied to the amplifier 206. The amplifier 206 may then return to its substantially non-deformed state, which in turn decreases the force applied onto the upper head portion 168b of the push rod 168. The push rod 168 may be biased by a coil spring 169 in a closing direction opposite the opening direction. As the force applied by the amplifier 206 onto the push rod 168 is reduced below the biasing force of the coil spring 169, the coil spring 169 moves the push rod 168 in the closing direction. The lower head portion 168a contacts the proximal end 176a of the needle 176 and pushes the needle 176 in the closing direction against the force of the coil spring 178 until a distal end 176b, disposed on the needle 176 opposite the proximal end 176a, engages against a valve seat 200 or is close to the valve seat 200 in a second position spaced from the first position. The coil spring 178 may have a lower stiffness than the coil spring 169 such that, absent external forces, the force exerted by the coil spring 169 in the closing direction is greater than the force exerted by the coil spring 178 in the opening direction.

In the process of moving the needle 176 from the first position to the second position, the distal end 176b of the needle 176 may force a droplet 202 of material from the discharge outlet 204 when the distal end 176b strikes or is close to the valve seat 200 of the discharge outlet 204. Additionally, during this dispensing operation, the applicator 100 can monitor the movement of one of the moving parts of the system. To do this, the applicator 100 can include a reference component 148 attached to the push rod 168 at the upper head portion 168b, as well as a position sensor 150 disposed within the actuator housing 118. The position sensor 150 is configured to detect and monitor the position of the reference component 148 as the push rod 168 moves upwards and downwards upon lengthening and contraction of the piezoelectric stack 140. The position sensor 150 is in electronic communication with a controller 112, and can continuously or periodically monitor and communicate the position of the reference component 148 to the controller 112. By monitoring the position of the reference component 148, the position sensor 150 also monitors the position of the mechanical amplifier 206 with which it is in contact during a dispensing operation. In one embodiment, the reference component 148 is a magnet and the position sensor 150 is a Hall effect sensor, though other configurations are also contemplated. Also, although the reference component 148 is depicted as attached to the push rod 168, the reference component 148 can be attached to any of the mechanical amplifier 206, the push rod 168, or the needle 176. The mechanical amplifier 206, push rod 168, and the needle 176 can collectively be referred to as the moving parts of the actuator. As the reference component 148 can be differently positioned, the position sensor 150 can similarly be repositioned within the actuator housing 118 so as to best monitor the position of the reference component 148. The method for using the position sensor 148 and reference component 150 to control the applicator 100 will be described further below.

The controller 112 can comprise any suitable computing device configured to host a software application for monitoring and controlling various operations of the applicator 10 as described herein. It will be understood that the controller 112 can include any appropriate computing device, examples of which include a processor, a desktop computing device, a server computing device, or a portable computing device, such as a laptop, tablet, or smart phone. Specifically, the controller 112 can include a memory 113 and an HMI device 114. The memory 113 can be volatile (such as some types of RAM), non-volatile (such as ROM, flash memory, etc.), or a combination thereof. The controller 112 can include additional storage (e.g., removable storage and/or non-removable storage) including, but not limited to, tape, flash memory, smart cards, CD-ROM, digital versatile disks (DVD) or other optical storage, magnetic tape, magnetic disk storage or other magnetic storage devices, universal serial bus (USB) compatible memory, or any other medium which can be used to store information and which can be accessed by the controller 112. The HMI device 114 can include inputs that provide the ability to control the controller 112, via, for example, buttons, soft keys, a mouse, voice actuated controls, a touch screen, movement of the controller 112, visual cues (e.g., moving a hand in front of a camera on the controller 112), or the like. The HMI device 114 can provide outputs, via a graphical user interface, including visual information, such as the visual indication of the current position and velocity values of the needle 176, as well as acceptable ranges for these parameters via a display. Other outputs can include audio information (e.g., via speaker), mechanically (e.g., via a vibrating mechanism), or a combination thereof. In various configurations, the HMI device 114 can include a display, a touch screen, a keyboard, a mouse, a motion detector, a speaker, a microphone, a camera, or any combination thereof. The HMI device 114 can further include any suitable device for inputting biometric information, such as, for example, fingerprint information, retinal information, voice information, and/or facial characteristic information, for instance, so as to require specific biometric information for access the controller 112.

It will be appreciated that the piezoelectric device 126 may be utilized in reverse to jet droplets. In this case, the various mechanical actuation structures may be designed differently such that when the voltage waveform is applied to the stack 140, the resulting expansion of the stack 140 causes movement of the needle 176 toward the valve seat 200 and causes the discharge outlet 104 to discharge a droplet 102 of material. Then, upon removal of the voltage to the stack 140, the amplification system and other actuation components would raise the needle 176 in order to charge the fluid bore 188 with additional material for the next jetting operation. In such aspects, the needle 176 would be normally open, i.e., not engaging the valve seat 200 when there is no voltage applied to the stack 140.

The amount of deformation of the amplifier 206 and, as a result, the degree of amplification of the movement of the stack 140 is determined, in part, by the relative positioning of the primary and secondary protrusions 222, 232 as they contact the primary and secondary surfaces 210, 212, respectively. When the voltage waveform is applied to the stack 140, the stack 140 lengthens and moves the distal end 220 to apply a force to the amplifier 206. The primary protrusion 222 at the distal end 220 may contact the primary surface 210 of the amplifier 206 at a first distance D1 away from the central axis A that extends through the geometric center of the amplifier 206. The base 230 is disposed on the other side of the amplifier 206 such that it is configured to contact the secondary surface 212. A secondary protrusion 232 may contact the secondary surface 212 at a second distance D2 away from the central axis A. To create a suitable lever action to amplify the distance moved by the distal end 220, the first distance D1 and the second distance D2 should be different.

Figure 12:
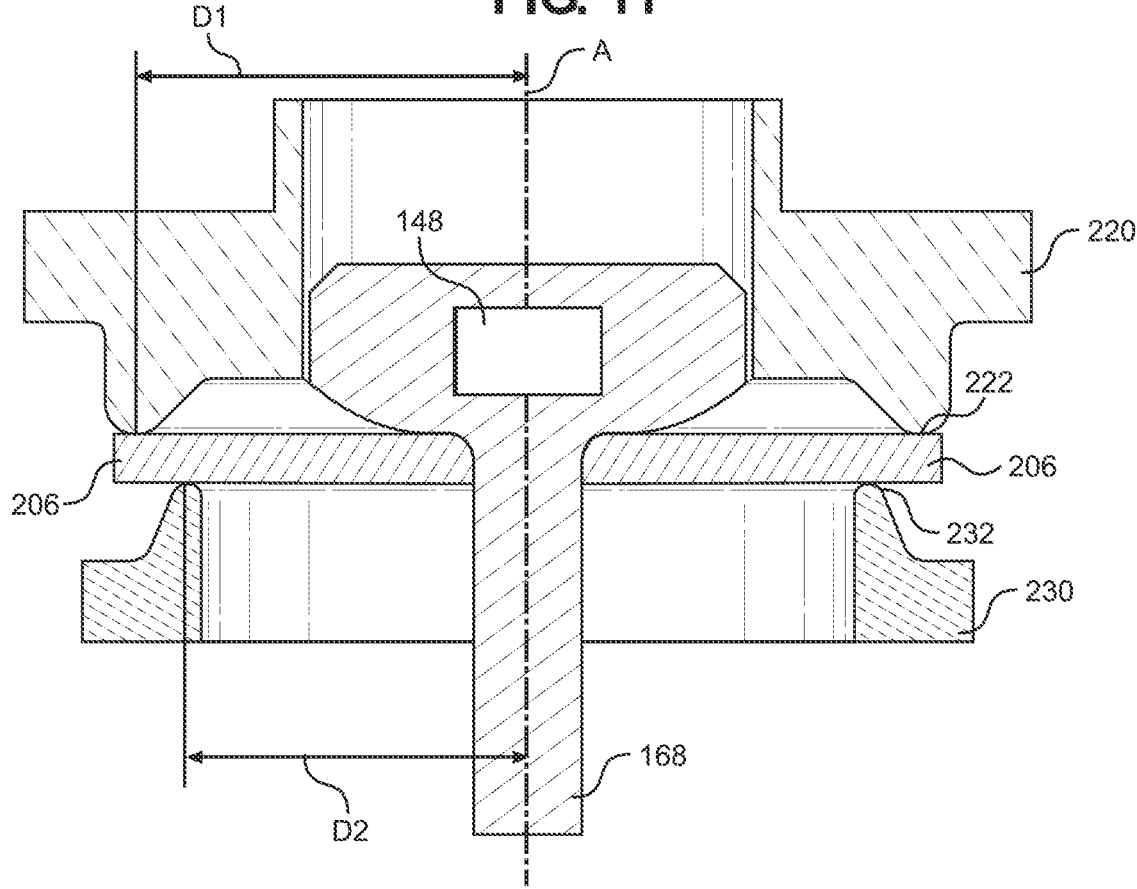
FIG. 12 is a cross-sectional view of the mechanical amplifier shown in FIG. 10, with the mechanical amplifier in an un-deformed configuration.
Figure 13:
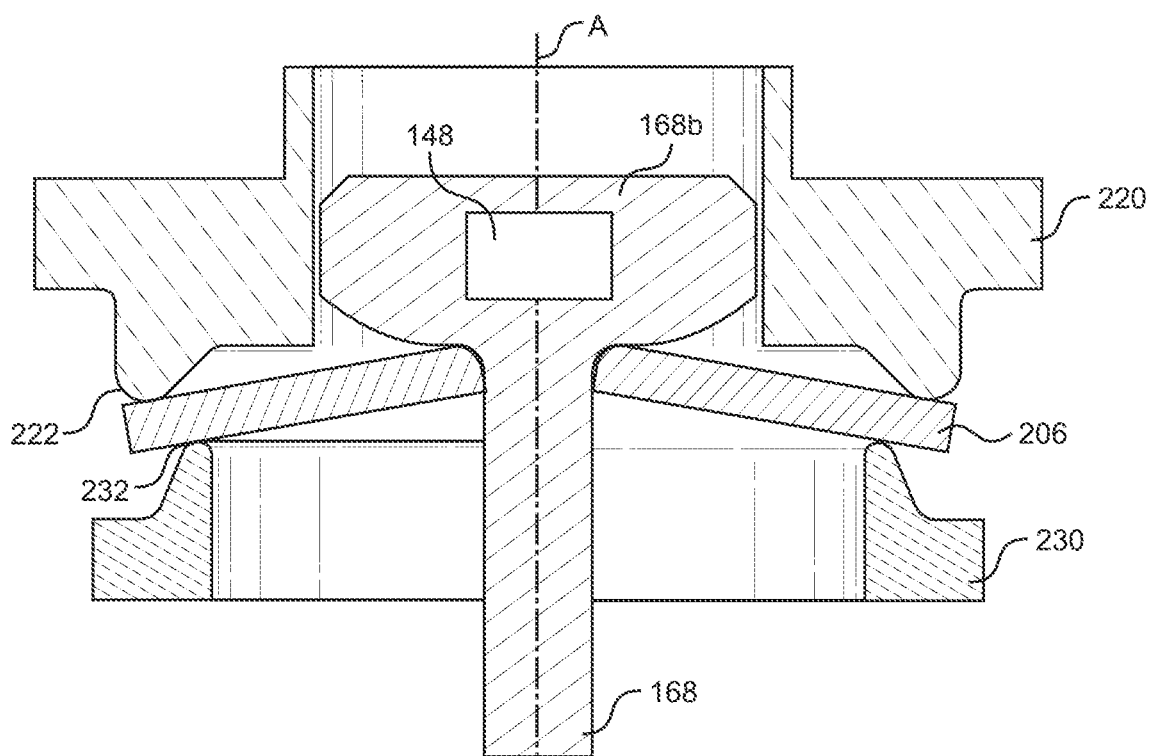
FIG. 13 is a cross-sectional view of the mechanical amplifier shown in FIG. 10, with the mechanical amplifier in a deformed configuration.

Referring to FIGS. 12-13, the first distance D1 may be greater than the second distance D2. When force is applied to the primary surface 214) by the primary protrusion 222, the secondary protrusion 232 acts as a fulcrum. Thus, as a portion of the amplifier 206 that is farther from the central axis A than the second distance D2 is pushed in one direction (e.g., downward) by the primary protrusion 222, another portion of the amplifier 206 that is closer to the central axis A than the second distance D2 is levered in an opposite direction (e.g., upward). The push rod 168 that is operatively coupled with the amplifier, e.g., at the interaction of the primary surface 210 or the lobes 216 and the upper head portion 168b, is thus moved in the same direction. FIG. 13 depicts an exemplary aspect where the stack 140 is lengthened and a force is applied onto the primary surface 210 of the amplifier 206. The amplifier 206 is thus deformed, and the upper head portion 168b, along with the rest of the push rod 168, is moved axially along the central axis A.

Figure 14:
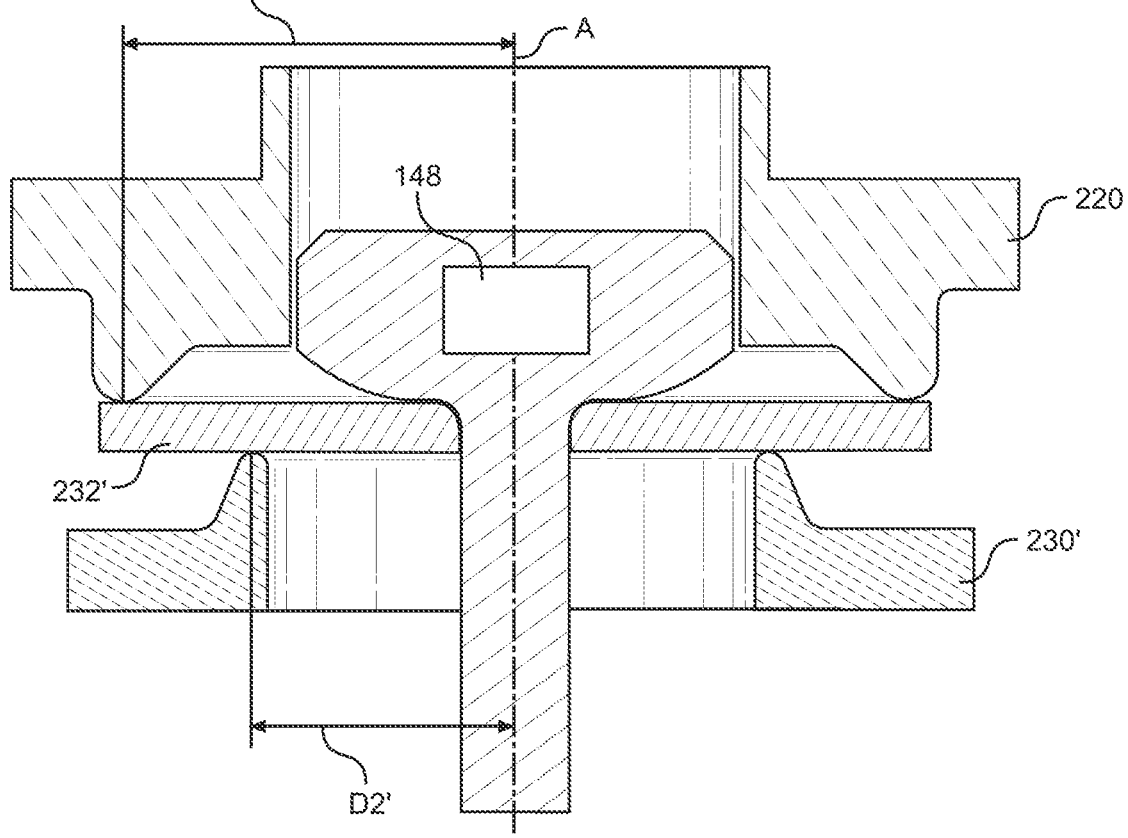
FIG. 14 is a cross-sectional view of the mechanical amplifier shown in FIG. 10, with the valve assembly in an alternative configuration.

The distance that the push rod 168 moves depends on the first and second distances D1, D2. As the second distance D2 increases (i.e., as the fulcrum gets farther from the central axis A), the distance that the push rod 168 moves will also increase. The amount of amplification may be controlled by increasing or decreasing the second distance D2. FIG. 14, for example, depicts an alternative embodiment including a base 230' having a secondary protrusion 232' that is disposed at a second distance D2' away from the central axis A. The second distance D2' is smaller than the second distance D2. As such, in an embodiment having base 230', the push rod 168 will move a smaller distance than it would in an aspect utilizing the base 230, resulting in a smaller comparable amplification (taking all other factors as equal).

While changing the second distance D2 is a suitable method of adjusting the amount of amplification, amplification may be changed in a variety of ways. In some aspects, the amplifier 206 may include a material that is configured to deform more easily (e.g., the material is softer or more elastic) or a material configured to be more rigid (e.g., the material is stiffer or less elastic). The thickness of the body 208 may be increased (to increase rigidity) or decreased (to increase pliability). In some aspects, the lobes 216 may be changed in thickness, material properties, and/or length (i.e., distance the lobes 216 extend from the body 208 to the central axis A).

The body 208 of the amplifier 206 may have a varying thickness (i.e., the distance between the primary surface 210 and the secondary surface 212) therethrough. In some aspects, for example, the body 208 may be at a maximum thickness farthest away from the opening 214 and at a minimal thickness closest to the opening 214, with the thickness gradually decreasing from the maximum to the minimum thickness. Alternatively, the body 208 may include one or more steps (not shown), each step having a different thickness, where, for example, the step farthest from the opening 214 is at the maximum thickness and the step closest to the opening 214 is at the minimum thickness.

Figure 15:
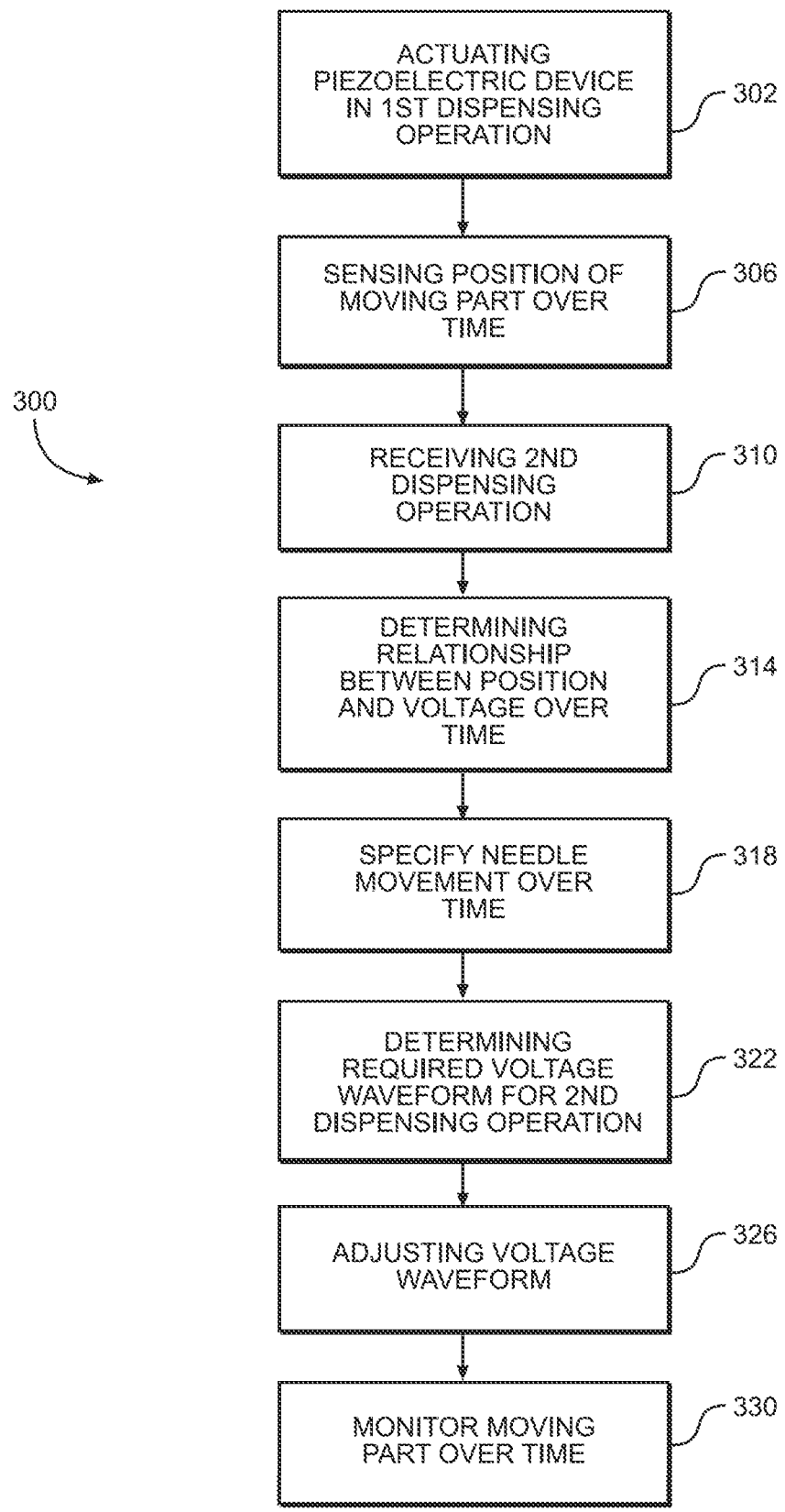
FIG. 15 is a process flow diagram of a method of controlling movement of a moving part of the applicator according to an embodiment of the present disclosure.

As previously described, each of the applicators 10, 100 can include a position sensor 71, 150 and a corresponding reference component 69, 148 attached to a moving part of the respective applicator 10, 100. Referring to FIG. 15, a method 300 is shown for controlling movement of a moving part of an applicator 10, 100 for jetting a material from the applicator 10, 100. As previously described, the moving part can be the needle 76, 176, the amplifier 24, 206, or the push rod 68, 168. Initially, in step 302, the piezoelectric device 26, 126 operatively connected to the needle 76, 176, respectively, is actuated by providing a voltage waveform to the piezoelectric device 26, 126. As a result of this voltage waveform being provided, the needle 76, 176 can translate along a positional path between a first position and a second position in a dispensing operation, which may also be referred to as a first dispensing operation. In one embodiment, the voltage waveform applied during step 302 has a trapezoidal form that induces rapid movement of the needle 76, 176. This dispensing operation can be a normal dispensing operation (i.e., one in which material is jetted from the applicator 10, 100), or alternatively an operation solely for monitoring movement of the needle 76, 176. Further, step 302 can include actuating the movement of the piezoelectric device 26, 126 through the use of a mechanical amplifier, such as the lever 24 or mechanical amplifier 206.

The next step in method 300 involves sensing a position of the moving part of the applicator 10, 100 over time during the dispensing operation in step 306. In one embodiment, the period of time can be 500-1000 milliseconds (ms), though various other periods of time are contemplated. The sensed positions of the moving part over time, along with the times at which they occur, can be collectively referred to as a time-dependent positional profile. Step 310 can be performed by the position sensor 71, 150, which can monitor the position of the reference component 69, 148. As previously noted, the reference component 69, 148 can be attached to any of the moving parts of the applicator 10, 100 (which can be the needle 76, 176, the amplifier 24, 206, or the push rod 68, 168). When the position sensor 71, 150 senses the position of the reference component 69, 148 over time, the position sensor 71, 150 can continuously transmit the time-dependent positional profile of the respective reference component 69, 148 to the controller 14, 112. Alternatively, the position sensor 71, 150 can intermittently transmit the time-dependent positional profile of the respective reference component 69, 148 to the controller 14, 112 at discrete intervals over a single or a plurality of dispensing cycles. Yet still, parameters determined based on the time-dependent positional profile(s) can be transmitted to the controller 14, 112 instead of the time-dependent positional profile(s) themselves. As noted above, position sensor 71, 150 can be a Hall effect sensor, and the reference component 69, 148 can be a magnet.

After the dispensing operation has commenced and the position of the moving part has been sensed, the controller 14, 112 can receive parameters for another dispensing operation, which can be referred to as a second dispensing operation, in step 310. The controller 14, 112 can receive the parameters via a user input into the HMI device 17, 114 of the controller 14, 112, respectively, and can be in the form of a type or size of material to be jetted, particular type of jetting operation, substrate or pattern for jetting the material, desired needle movement, etc. Though shown as being performed immediately after step 302, step 306 can be performed at any other time during method 300.

Continuing with FIG. 15, next in method 300, the controller 14, 112 can determine a relationship between the time-dependent positional profile of the moving part over the period of time and the voltage waveform applied to the piezoelectric device 26, 126 in the dispensing operation in step 314. This relationship can take the form of a parametrized mathematical equation that models the dynamic response of the moving part to the voltage waveform applied to the piezoelectric device 26, 126. For example, the equation can be a polynomial in the time domain. To do this, the controller 14, 112 can input the movement of the moving part sensed by the position sensor 71, 150 over time, as well as the voltage waveform provided to the piezoelectric device 26, 126, into a best fit model to produce the model equation. In one embodiment, the best fit model is an autoregressive moving average with exogenous input (ARMAX) model, though other best fit models are contemplated. The time period over which the voltage waveform and movement of the moving part sensed by the position sensor 71, 150 that is utilized to produce the model equation may be one dispensing operation of the piezoelectric device 26, 126 (movement to jet one discrete amount of material), multiple dispensing operations, etc.

Once step 314 has been performed, in step 318 the controller 14, 112 can use the user input received in step 306 to define the desired movement of the corresponding piezoelectric stack 40, 140 that would produce the desired dispensing operation, and likewise specify the desired movement of the needle 76, 176. The controller 14, 112 can use model parameters of the material and/or applicator 10, 100 stored in the memory 15, 113 and/or algorithms that determine an ideal position profile over time based on the user input, to determine the desired movement of the piezoelectric stack 40, 140 for the second dispensing operation. Using this desired movement, step 322 can be performed, in which the controller 14, 112 determines a required voltage waveform to be applied to the piezoelectric device 26, 126 for the needle 76, 176 to perform the second dispensing operation. This step is performed by inputting the desired movement profile of the needle 76, 176 into the controller 14, 112 to produce a voltage waveform. This voltage waveform then is inputted into the mathematical equation devised in step 314 to produce a movement of the needle 76, 176. This output of the mathematical equation can be inputted into a subtraction junction that finds the difference between the desired movement of the needle 76, 176 and the movement of the needle 76, 176 calculated by the mathematical equation. However, other methods of creating the voltage waveform are contemplated. In addition to the mathematical model, the controller 14, 112 can reference model parameters, such as aspects of the material to be jetted, that are stored in the memory 15, 113 of the controller 14, 112 to determine the required voltage. The required voltage can comprise a trapezoidal waveform, or any other waveform that is suited to produce the desired piezoelectric device movement.

After the required voltage is determined in step 322, the controller 14, 112 can adjust the voltage waveform provided to the piezoelectric device 26, 126 in step 326 to match the required voltage determined in step 322. In one embodiment, the voltage waveform can be adjusted every 5 microseconds (µs), though other increments are contemplated. As a result, after step 322, the applicator 10, 100 can commence the second dispensing operation specified in step 306. While the second dispensing operation is ongoing, the position of the moving part can be monitored over time in step 330. Step 330 ensures that changes in the movement of the moving part being monitored can be detected, and the voltage waveform supplied to the piezoelectric device 26, 126 can be fine-tuned in order to achieve a consistent dispensing operation. The position of the moving part can be monitored on a continuous basis or intermittently over time. For example, the position of the moving part can be monitored once every 100 dispense cycles. However, this number of dispense cycles is only exemplary.

Figure 16A:
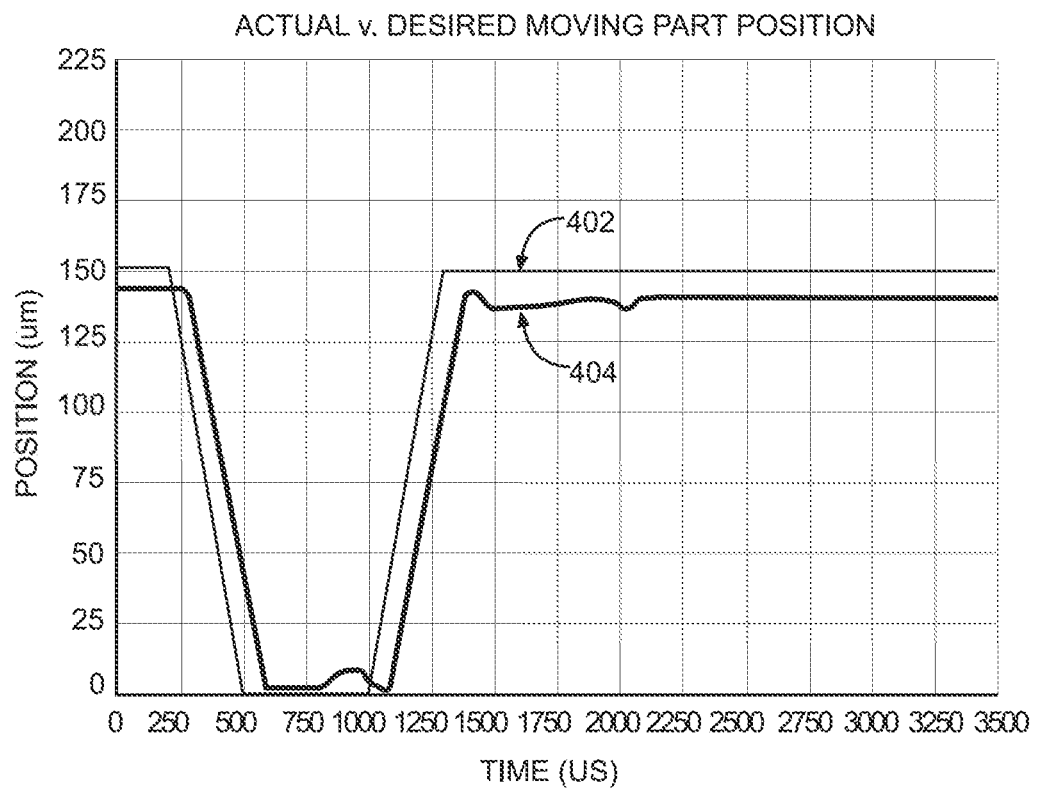
FIG. 16A is a graph depicting a desired moving part trajectory over time and an actual moving part trajectory produced according to an embodiment of the present disclosure.
Figure 16B:
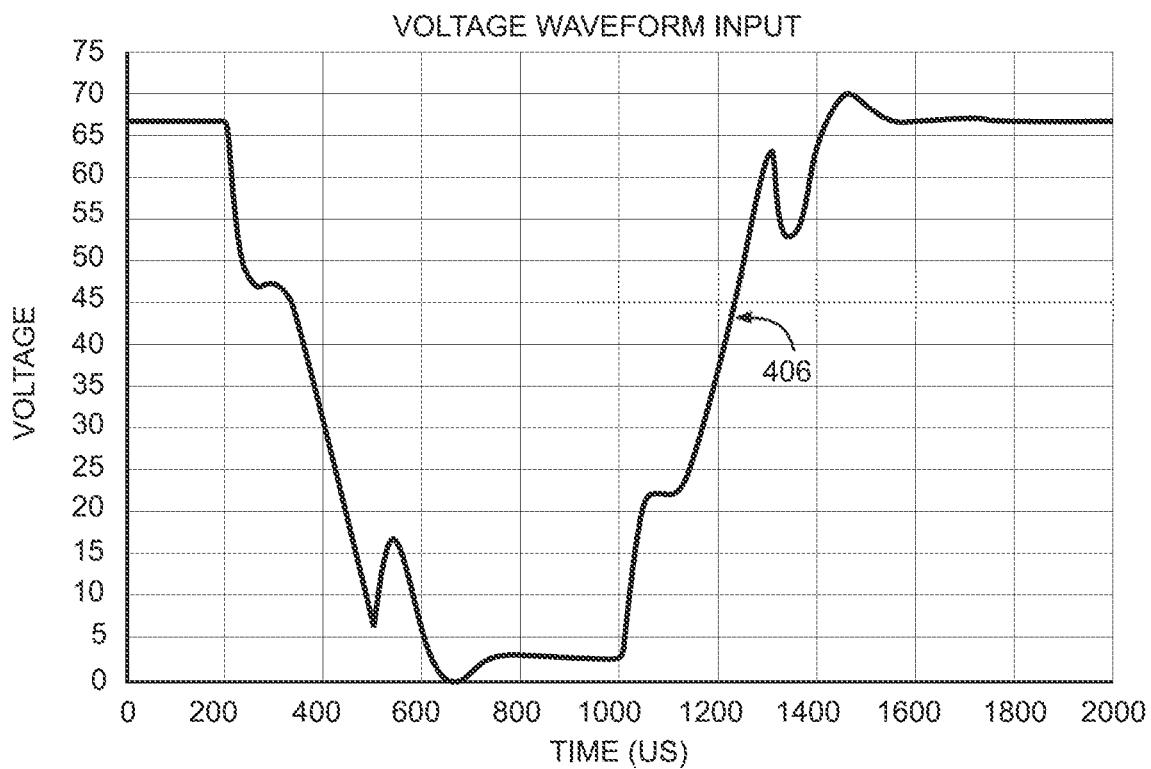
FIG. 16B is a graph depicting a voltage waveform produced according to an embodiment of the present disclosure to produce the actual moving part trajectory shown in FIG. 16A.

Now referring to FIGS. 16A-16B, graphs are shown depicting the position of the moving part of an applicator 10, 100 over time, and the voltage waveform input as determined according to method 300 used to produce the movement profile shown. As shown in FIG. 16A, the desired position of the moving part as shown by line 402 has a distinctly trapezoidal waveform, involving a quick movement from a first position (230-500 µs), a pause in the second position (500-1000 µs), and another quick movement from the second position back to the first position (100-1275 µs). In this movement, the first position can correspond to the above-described first position of the needle 76, 176, and the second position can correspond to the second position of the needle 76, 176. In contrast with the desired positional profile, the actual position of the moving part over time is shown using line 404. The actual position over time can be seen as closely following the desired position, with little deviation. Further, the line 404 shows relatively few bumps or other deviations from the shape of line 402. This is due to the use of the voltage waveform determined according to method 300, which is shown in FIG. 16B as line 406. The method 300 allows the voltage waveform to cause a positional movement that accounts for damping, oscillation, and momentum of the various moving parts of the applicator 10, 100.

Figure 17A:
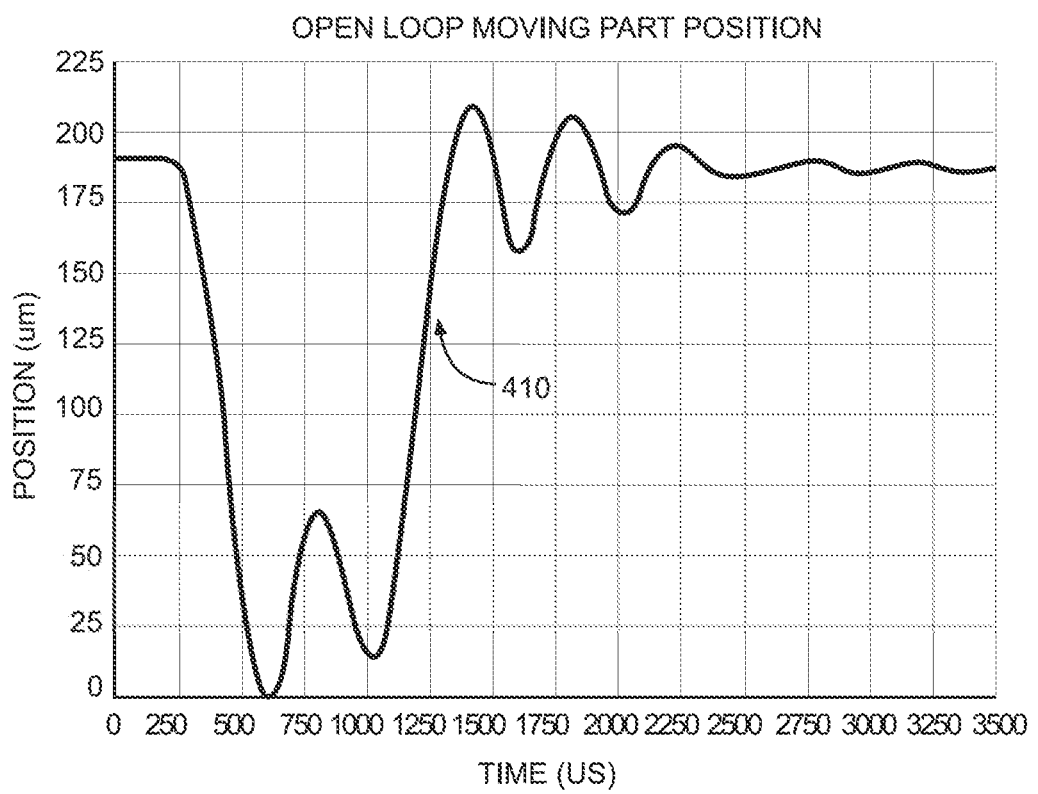
FIG. 17A is a graph depicting an actual moving part trajectory produced using a conventional open loop system.
Figure 17B:
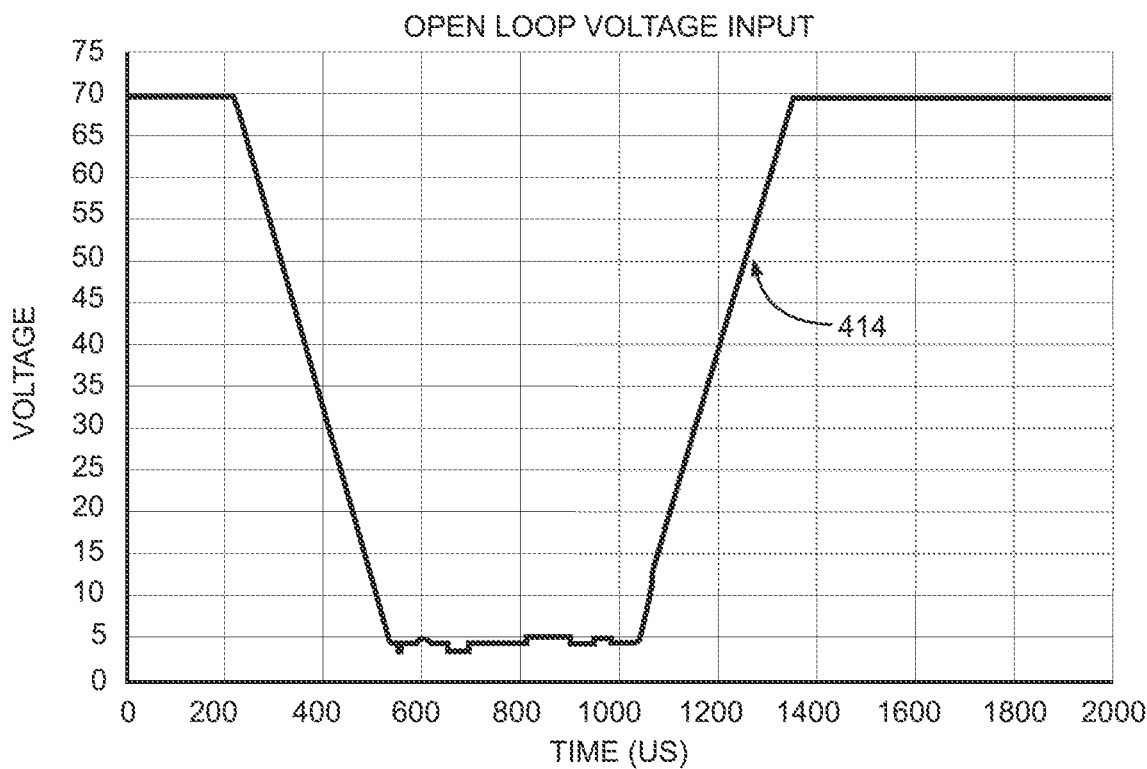
FIG. 17B is a graph depicting the voltage waveform used to produce the actual moving part trajectory shown in FIG. 17A.

In contrast, with reference to FIGS. 17A-17B, graphs are shown depicting the position of a moving part of an applicator over time and the voltage waveform input used to create that positional movement, where the voltage waveform was produced through a system using an open loop. As shown in FIG. 17A, the position of the moving part is represented by line 410 using an open loop in an attempt to achieve the desired position of the moving part shown in FIG. 16A and represented by line 402. However, line 410 includes undesired oscillation and consistently overshoots the desired value, which adversely affects the qualities of any material jetted. The voltage waveform used to produce this positional movement is shown in FIG. 17B and represented by line 414. When comparing the two separate positional movements, the positional movement 404 produced by the voltage waveform obtained according to method 300 tracks the desired movement trajectory much closer than the positional movement 410 produced by the voltage waveform obtained from an open feedback loop.

Further, the previously described applicators 10, 100 provide benefits over currently existing open loop applicator systems due to the dynamic and individualized nature in which voltage can be applied to the piezoelectric device. Various applicators, in addition to being underdamped, which causes oscillation during needle translation, have their own unique tolerances, natural frequencies, damping forces, etc. As a result, identical dispensing operations can require different voltages applied to the piezoelectric devices of different systems. Additionally, needle movement can vary over time due to part wear or environmental changes. By dynamically monitoring the moving parts of an applicator and modeling the movement of these parts, the applicator can determine the required voltage for a particular, unique applicator to accurately perform a desired dispensing operation. Also, the applicator can alter this required voltage over time to accommodate changes within the applicator or in the environment in which the applicator is located. As a result, an operator can exercise direct control over needle movement, rather than just controlling the excitation of the piezoelectric device. This can lead to more accurate and precise process controls of material dispensing and the development of new voltage waveforms to provide to the piezoelectric device.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts, and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure; however, such values and ranges are not to be construed in a limiting sense and are intended to be critical values or ranges only if so expressly stated. Moreover, while various aspects, features, and concepts may be expressly identified herein as being inventive or forming part of an invention, such identification is not intended to be exclusive, but rather there may be inventive aspects, concepts, and features that are fully described herein without being expressly identified as such or as part of a specific invention, the scope of the inventions instead being set forth in the appended claims or the claims of related or continuing applications. Descriptions of exemplary methods or processes are not limited to inclusion of all steps as being required in all cases, nor is the order that the steps are presented to be construed as required or necessary unless expressly so stated.

While the invention is described herein using a limited number of embodiments, these specific embodiments are not intended to limit the scope of the invention as otherwise described and claimed herein. The precise arrangement of various elements and order of the steps of articles and methods described herein are not to be considered limiting. For instance, although the steps of the methods are described with reference to sequential series of reference signs and progression of the blocks in the figures, the method can be implemented in a particular order as desired.

What is claimed is:

1. A method of controlling movement of a moving part of an applicator for jetting material from the applicator, the method comprising:

actuating a piezoelectric device operatively connected to a needle by providing a voltage waveform to the piezoelectric device, such that the moving part translates along a positional path in a first dispensing operation;

sensing positions of the moving part over a period of time, wherein the positions define a time-dependent positional profile of the moving part that represents a dynamic response of the moving part;

generating, with a controller and based on the sensed positions of the moving part, a model of the dynamic response of the moving part to the voltage waveform applied to the piezoelectric device;

receiving parameters for a second dispensing operation;

determining, with the controller and based on the parameters for the second dispensing operation, a desired position profile for the second dispensing operation that characterizes a desired movement of the piezoelectric device for the second dispensing operation;

determining, with the controller, a required voltage waveform to be applied to the piezoelectric device to perform the second dispensing operation by applying the desired position profile for the second dispensing operation to the model; and applying the required voltage waveform to the piezoelectric device to perform the second dispensing operation.

2. The method of claim 1, wherein determining the required voltage waveform to be applied to the piezoelectric device to perform the second dispensing operation is based on the parameters for the second dispensing operation and parameters based on the sensed positions of the moving part for a plurality of dispensing cycles.

3. The method of claim 1, wherein applying the required voltage waveform has a unique voltage and time relationship.

4. The method of claim 1, wherein the moving part is an amplifier operatively connected to the piezoelectric device, a push rod operatively connected to the amplifier, or the needle.

5. The method of claim 1, wherein the positions of the needle are sensed using a Hall effect sensor.

6. The method of claim 1, wherein determining the required voltage waveform to be applied to the piezoelectric device to perform the second dispensing operation includes referencing model parameters of the material to be dispensed in the second dispensing operation.

7. The method of claim 1, wherein the parameters of the second dispensing operation include a type or size of the material to be dispensed in the second dispensing operation.

8. The method of claim 1, wherein the required voltage waveform has a trapezoidal shape.

9. The method of claim 1, wherein actuating the piezoelectric device comprises amplifying movement of the piezoelectric device.

10. The method of claim 1, wherein the model is a best fit model.

11. The method of claim 10, wherein the model is generated based on sensed positions of the moving part over a time period that includes multiple dispensing operations.

12. A method of associating movement of a moving part with voltage applied to an actuator, the method comprising:

providing a voltage waveform to a piezoelectric device operatively connected to the moving part, such that the moving part translates along a positional path in a dispensing operation;

sensing positions of the moving part during the dispensing operation, wherein the positions define a time-dependent positional profile of the moving part that represents a dynamic response of the moving part; and generating, with a controller and based on the sensed positions of the moving part, a model of the dynamic response of the moving part to the voltage waveform applied to the piezoelectric device.

13. The method of claim 12, wherein the moving part is an amplifier operatively connected to the piezoelectric device, a push rod operatively connected to the amplifier, or a needle operatively connected to the push rod.

14. The method of claim 12, wherein the model is determined according to a best fit model.

15. The method of claim 12, wherein sensing the positions of the moving part is performed using a Hall effect sensor.

16. The method of claim 15, further comprising:
monitoring the positions of the moving part at a predetermined interval during the dispensing operation.

17. The method of claim 12, further comprising:
receiving parameters of a desired dispensing operation; and
determining, based on the parameters for a second dispensing operation, a desired position profile for the second dispensing operation that characterizes a movement of the moving part based on the parameters of the desired dispensing operation.

18. The method of claim 17, wherein determining the desired position profile includes referencing parameters of a material to be jetted that relate the voltage waveform applied to the piezoelectric device and the time-dependent positional profile of the moving part.

19. An applicator for jetting material, the applicator comprising:
a valve including a valve seat and a needle configured to translate between a first position and a second position in a dispensing operation for jetting material from the valve;
a piezoelectric device for moving the needle in response to receiving a voltage;
an amplifier operatively connected between the piezoelectric device and the needle;
a position sensor for monitoring positions of a moving part, wherein the positions define a time-dependent positional profile of the moving part that represents a dynamic response of the moving part, the moving part comprising the needle, the amplifier, or a push rod operatively connected to the amplifier; and
a controller in electrical communication with the piezoelectric device and the position sensor, wherein the controller is configured to:
generate, based on the sensed positions of the moving part, a model of the dynamic response of the moving part to a voltage waveform applied to the piezoelectric device; and
determine a required voltage waveform to be applied to the piezoelectric device to perform a dispensing operation by applying a desired position profile for the dispensing operation to the model.

20. The applicator of claim 19, further comprising a magnet operatively connected to the moving part, and wherein the position sensor is a Hall effect sensor.

21. The applicator of claim 19, wherein the amplifier is a disc having a substantially round cross-section.

22. The applicator of claim 19, wherein the amplifier is a lever.

23. The applicator of claim 19, wherein the needle is spaced from the valve seat in the first position, and the needle contacts the valve seat in the second position.

24. The applicator of claim 19, wherein the needle is spaced by a first distance from the valve seat in the first position, and spaced by a second distance from the valve seat in the second position, the second distance being less than the first distance.

* * * * *